United States Patent [19]
Kamikawa et al.

[11] Patent Number: 6,050,275
[45] Date of Patent: Apr. 18, 2000

[54] APPARATUS FOR AND METHOD OF CLEANING OBJECTS TO BE PROCESSED

[75] Inventors: Yuji Kamikawa, Koshi-machi; Satoshi Nakashima, Kikusui-machi; Kinya Ueno, Nirasaki, all of Japan

[73] Assignee: Tokyo Electron Limited, Tokyo, Japan

[21] Appl. No.: 08/936,526

[22] Filed: Sep. 24, 1997

[30] Foreign Application Priority Data

Sep. 27, 1996 [JP] Japan .................................. 8-256638

[51] Int. Cl.7 .................................................. B08B 3/00
[52] U.S. Cl. ...................... 134/105; 134/102.3; 134/200; 134/902
[58] Field of Search .................... 134/105, 107, 134/902, 200, 102.3

[56] References Cited

U.S. PATENT DOCUMENTS

| | | |
|---|---|---|
| 4,132,235 | 1/1979 | Koplin et al. ............................ 134/200 |
| 4,558,524 | 12/1985 | Peck et al. ............................... 134/902 |
| 4,694,527 | 9/1987 | Yoshizawa ............................... 134/902 |
| 4,983,223 | 1/1991 | Gessner ................................... 134/105 |
| 5,186,192 | 2/1993 | Netsu et al. ............................. 134/200 |
| 5,368,649 | 11/1994 | Tsukazaki . | |
| 5,369,891 | 12/1994 | Kamikawa . | |
| 5,443,540 | 8/1995 | Kamikawa . | |
| 5,520,744 | 5/1996 | Fujikawa et al. . | |
| 5,657,553 | 8/1997 | Tarui et al. . | |

FOREIGN PATENT DOCUMENTS

| | | |
|---|---|---|
| 64-81230 | 3/1989 | Japan . |
| 81230 | 3/1989 | Japan . |
| 3-70134 | 3/1991 | Japan . |
| 326073 | 11/1994 | Japan . |
| WO 9208554 | 5/1992 | WIPO . |

*Primary Examiner*—Frankie L. Stinson
*Attorney, Agent, or Firm*—Smith, Gambrell & Russell, LLP

[57] ABSTRACT

A cleaning apparatus and a cleaning method for cleaning an object are provided. In the cleaning apparatus, a drying chamber 42 and a cleaning bath 41 are separated from each other up and down, respectively. Thus, a space in the drying chamber 42 can be insulated from a space of the cleaning bath 41 through rotary doors 59*a* and a slide door 72. In the cleaning method, a cleaning process in the cleaning bath 41 is carried out while sealing it by the rotary doors 59*a*. On the other hand, a drying process in the drying chamber 42 is accomplished while sealing and closing it by the slide door 72. Consequently, there is no possibility that, during the drying process, the object is subjected to a bad influence from a chemical treatment.

19 Claims, 20 Drawing Sheets

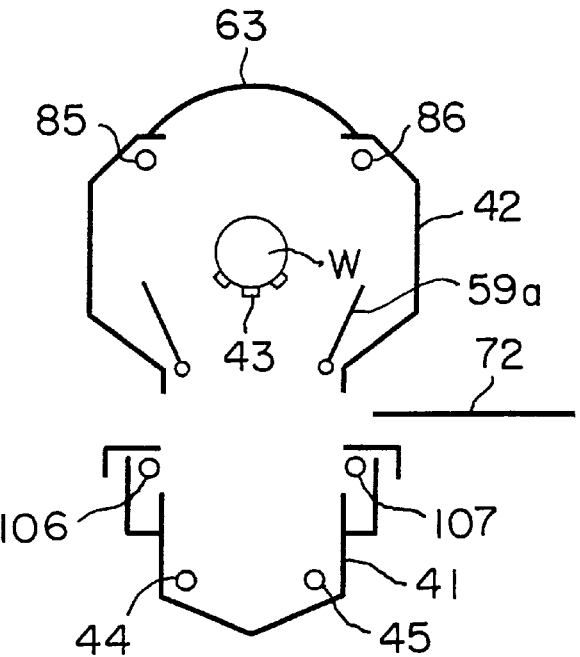
F I G. 18
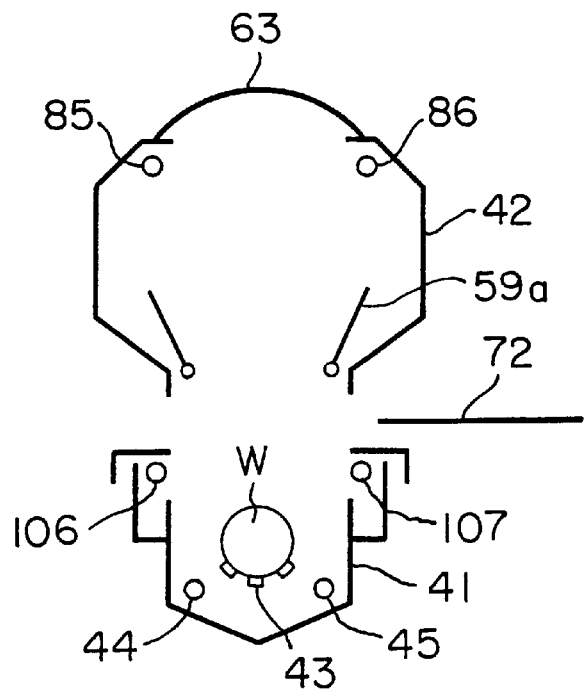
F I G. 19

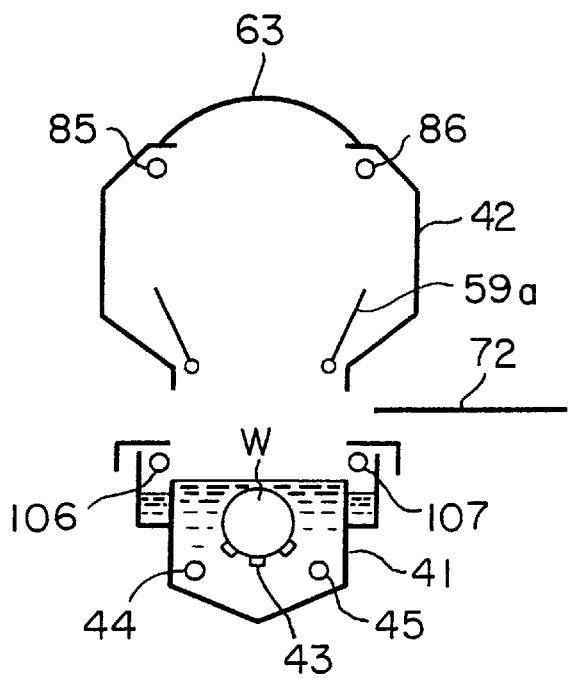
F I G. 22
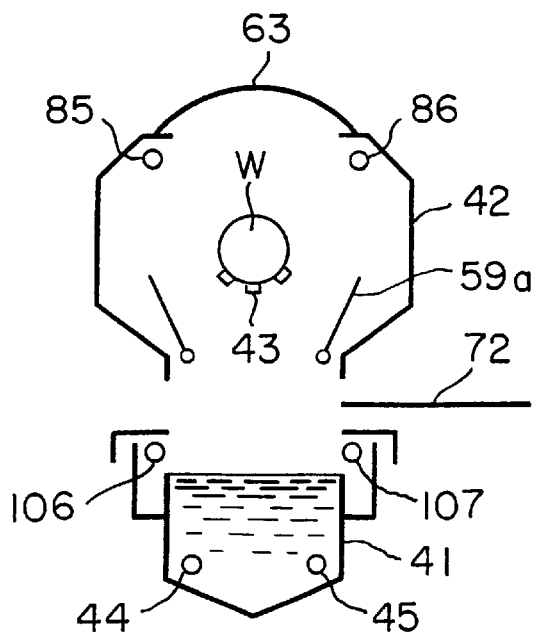
F I G. 23

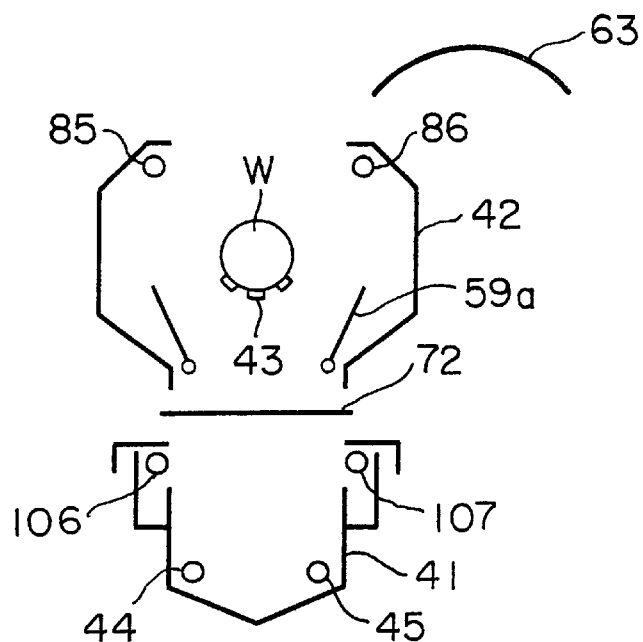
F I G. 26
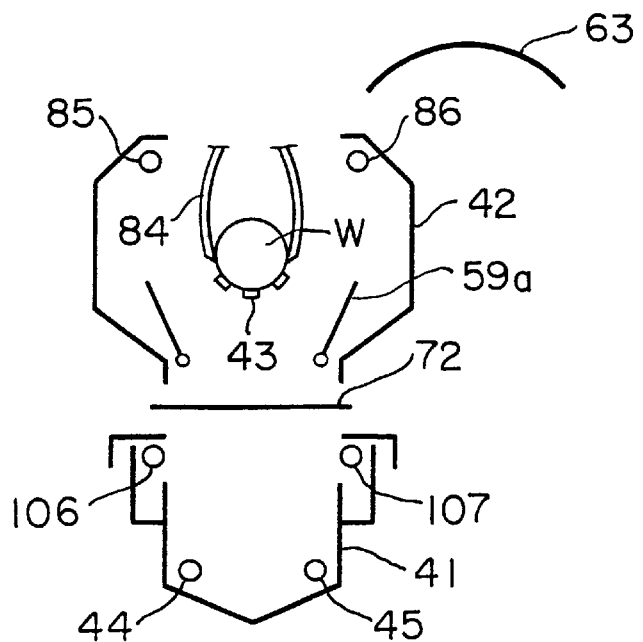
F I G. 27

APPARATUS FOR AND METHOD OF CLEANING OBJECTS TO BE PROCESSED

BACKGROUND OF THE INVENTION

The present invention relates to a cleaning apparatus and a cleaning method, by which objects to be processed, such as semiconductor wafers and glass substrates for a LCD (liquid crystal display) unit etc., are immersed and cleaned in chemical and subsequently dried.

For example, in a cleaning treatment of a manufacturing process for a semiconductor device, such as LSI etc., various cleaning apparatuses are employed for removing contaminants on the surfaces of the semiconductor wafers, such as particles, organic contaminants, metallic impurities and so on, and for etching the surface of the wafer. Note, in this specification, the semiconductor wafer(s) will be called the wafer(s) for short, hereinafter. Above all, a cleaning apparatus of "wet" type comes into wide use on the grounds that the above contaminants can be removed effectively, etching can be done and a batch processing can be accomplished to enhance the throughput in the cleaning process.

In such a wet type of cleaning apparatus, the wafers to be cleaned are subjected to a chemical cleaning process (e.g. ammonia treatment, hydrogen fluoride treatment, sulfuric acid treatment etc.), a washing cleaning process using pure water etc., and a drying process using isopropyl alcohol $[(CH_3)_2CHOH]$ or the like. Note, the isopropyl alcohol will be referred to an IPA, hereinafter. Further, the cleaning apparatus is so constructed to supply the chemicals, the pure water and the IPA to processing baths in processing order and a drying room, respectively. Thus, with the above arrangement, a batch processing method where the wafers in blocks of e.g. 50 sheets are successively immersed in the processing baths and dried in the drying room, comes into wide use.

However, the provision of the processing baths and the drying room for each process causes the apparatus to be large-sized undesirably. In addition, because of a lot of opportunities for transporting the wafers in the apparatus, in other words, being exposed to atmosphere, there is a great possibility of the particles' sticking to the wafers.

Therefore, in e.g. Japanese Unexamined Patent Publication (kokai) No. 64-81230 and the same No. 6-326073 etc., there are proposed cleaning apparatuses in each of which the processing baths and the drying room are formed in one body, so that the above-mentioned chemical process and drying process are carried out in one chamber. FIG. 1 shows one example of the cleaning apparatuses in the publications, representatively.

The shown cleaning apparatus comprises a chamber 200 and chemical (liquid) 202 stored in a lower portion 201 of the chamber 200. In processing, a wafer W is firstly immersed in the chemical 202. Thereafter, the wafer W is pulled up from the chemical 202 and then subjected to the drying process using the IPA etc. at an upper portion 203 of the chamber 200.

In the above-mentioned drying process while heating, however, there is a possibility that chemical atmosphere remaining in an upper area of the chamber 200 exerts a bad influence on the wafer W during the drying process. Furthermore, since there is a need to meet respective requirements of the chemical and drying processes simultaneously, the degree of freedom is restricted in design of the cleaning apparatus. Therefore, it is difficult to adopt various ideas to realize a high-speed cleaning process, a miniaturization of the chamber and so on. Meanwhile, in the drying process using the above IPA etc., it is generally executed to decompress the chamber by using a vacuum pump or the like. However, since the chamber in the cleaning apparatus constructed above, in which the chemical treatment etc. and the sequent drying process are executed together, has to have a large capacity volume to a certain extent, there are problems to be solved that it is necessary to increase a wall thickness of the chamber in order to ensure the pressure tightness and a high power vacuum pump is also required.

SUMMARY OF THE INVENTION

Accordingly, it is therefore an object of the present invention to provide a cleaning apparatus and a cleaning method, by which an object to be processed is not subjected to a bad influence from the chemical process during the drying process.

It is the other object of the present invention to provide a cleaning apparatus which has a high degree of freedom in design thereby to clean the objects rapidly and miniaturize the apparatus itself, and a cleaning method realized by using the cleaning apparatus.

It is the further object of the present invention to provide a cleaning apparatus which is capable of reducing the capacity of the chamber thereby to decrease a wall thickness of the chamber and an output required for the vacuum pump, and a cleaning method realized by using the cleaning apparatus.

It is the other object of the present invention to provide a cleaning apparatus and a cleaning method, by which it is possible to execute the drying process more effectively.

It is the other object of the present invention to provide a cleaning apparatus which is capable of preventing surfaces of the objects from being oxidized.

It is the other object of the present invention to provide a cleaning apparatus in which a processing bath and a drying section are separated from each other thereby to prevent mist etc. of treatment liquids from entering into a drying chamber thereby to accomplish a stable drying performance of the apparatus, and a cleaning method realized by using the cleaning apparatus.

As a first feature of the present invention, the above-mentioned objects described above can be accomplished by a cleaning apparatus comprising:

a processing bath for storing processing liquid in which the object is immersed;

a drying chamber arranged above the processing bath and provided with an opening which is disposed between a body of the drying chamber and the processing bath and through which the object is transported, the opening being capable of closing;

transporting means for transporting the object between the processing bath and the drying chamber through the opening; and means for filling the drying chamber with an atmosphere of organic solvent.

Further, a second feature of the present invention resides in the cleaning apparatus in accordance with the first feature, wherein the opening further includes sealing means for sealing the drying chamber when the opening is closed.

As a third feature of the present invention, the above-mentioned objects described above can be also accomplished by a cleaning apparatus for cleaning an object to be processed, the apparatus comprising:

a processing bath for storing processing liquid in which the object is immersed;

a drying chamber arranged above the processing bath and provided with an opening which is disposed between a body of the drying chamber and the processing bath and through which the object is transported, the opening being capable of closing;

a retaining member for retaining the object;

a supporting member for supporting the retaining member from the drying chamber's side, the supporting member being inserted into the processing bath through the opening in case of disposing the retaining member in the processing bath;

moving means for moving the object between the processing bath and the drying chamber by the supporting member;

first open and close means for opening and closing the opening, the first open and close means being constructed so as to seal the drying chamber at the first open and close means' closing condition;

second open and close means for opening and closing the opening, the second open and close means being constructed so as to close the opening while leaving a clearance allowing the supporting member to pass there-through at the second open and close means' closing condition; and means for filling the drying chamber with an atmosphere of organic solvent.

As a fourth feature of the present invention, the above objects can be also accomplished by a cleaning apparatus for cleaning a object to be processed, the apparatus comprising:

a processing bath for storing processing liquid in which the object is immersed;

a drying chamber arranged above the processing bath and provided with an opening which is disposed between a body of the drying chamber and the processing bath and through which the object is transported, the opening being capable of closing;

a retaining member for retaining the object;

a supporting member for supporting the retaining member from the drying chamber's side, the supporting member being inserted into the processing bath through the opening in case of disposing the retaining member in the processing bath;

moving means for moving the object between the processing bath and the drying chamber by the supporting member;

open and close means for opening and closing the opening, the open and close means being constructed so as to seal the drying chamber at a first closing mode of the open and close means and close the opening while leaving a clearance allowing the supporting member to pass there-through at a second closing mode of the open and close mean; and means for filling the drying chamber with an atmosphere of organic solvent.

A fifth feature of the present invention resides in the cleaning apparatus in accordance with any one of the first feature to the fourth feature, wherein the processing liquid stored in the processing bath is a deaerated rinse.

A sixth feature of the present invention resides in the cleaning apparatus in accordance with the fifth feature, further comprising first blowing means arranged between the processing bath and the drying chamber, for blowing inert gas against the object transported from the processing bath to the drying chamber.

A seventh feature of the present invention resides in the cleaning apparatus in accordance with the sixth feature, further comprising cooling means for cooling the inert gas.

An eighth feature of the present invention resides in the cleaning apparatus in accordance with the seventh feature, further comprising:

decompressing means for decompressing the drying chamber; and second blowing means for blowing the inert gas against the object in the drying chamber.

A ninth feature of the present invention resides in the cleaning apparatus in accordance with any one of the first feature to the fourth feature, further comprising heating means arranged in the drying chamber, for heating the interior of the drying chamber.

A tenth feature of the present invention resides in the cleaning apparatus in accordance with any one of the first feature to the fourth feature, wherein the processing liquid stored in the processing bath is a cooled rinse.

As an eleventh feature of the present invention, the above objects can be also accomplished by a cleaning method of cleaning a object to be processed, the cleaning method comprising the steps of:

(a) transporting the object from a drying chamber into a processing bath through a lower opening formed in the drying chamber while retaining the object by a retaining member supported on the drying chamber's side;

(b) closing the lower opening;

(c) storing processing liquid in the processing bath before or after transporting the object from drying chamber into the processing bath and subsequent immersing the object in the processing liquid;

(d) opening the lower opening to transport the object from the processing bath into the drying chamber;

(e) closing the lower opening; and (f) drying the object by an atmosphere of organic solvent in the drying chamber.

A twelfth feature of the present invention resides in the cleaning method in accordance with the eleventh feature, further comprising a step of filling up the drying chamber with inert gas after the object has been transported from an outside of the cleaning apparatus into the drying chamber, the step preceding the step (b).

A thirteenth feature of the present invention resides in the cleaning method in accordance with the eleventh feature, wherein inert gas is supplied into the processing bath in any one of the steps (a) to (f).

A fourteenth feature of the present invention resides in the cleaning method in accordance with the eleventh feature, wherein gas containing organic solvent is supplied into the processing bath before the step (d).

A fifteenth feature of the present invention resides in the cleaning method in accordance with the eleventh feature, wherein gas containing organic solvent is supplied into the processing bath before and during the step (d).

A sixteenth feature of the present invention resides in the cleaning method in accordance with the eleventh feature, wherein, in the step (b), the lower opening is closed while leaving a clearance for allowing the object to be carried from the drying chamber's side.

A seventeenth feature of the present invention resides in the cleaning method in accordance with the eleventh feature, wherein, in the step (e), the lower opening is closed to sealed up the drying chamber.

A eighteenth feature of the present invention resides in the cleaning method in accordance with the eleventh feature, further comprising a step of blowing inert gas against the object on transportation from the processing bath into the drying chamber.

An nineteenth feature of the present invention resides in the cleaning method in accordance with the eleventh feature or the seventeenth feature, after executing the step (f), further comprising a step of blowing inert gas against the object in the drying chamber while decompressing the drying chamber.

A twentieth feature of the present invention resides in the cleaning method in accordance with the eighteenth feature, between the steps (b) and (d), further comprising a step of filling the drying chamber with an atmosphere of organic solvent.

A twenty-first feature of the present invention resides in the cleaning method in accordance with the nineteenth feature, the processing liquid stored in the processing bath is a cooled rinse.

According to the first feature of the invention, since the drying chamber and the processing bath are separated from each other up and down while a space of the drying chamber can be insulated from a space of the processing bath through the closing opening, the object has no possibility to receive a bad influence from the chemical treatment during the drying process. In addition, since the arrangement allows the drying chamber and the processing bath to be designed under respective conditions independent of each other, it is possible to optimize the cleaning process and further miniaturize the cleaning apparatus because of the enhanced degree of freedom in the process design. Moreover, since the above-mentioned arrangement allows the volume of the drying chamber to be reduced, it is possible to reduce the wall thickness of the drying chamber and the processing bath when it is required to decompress the drying chamber while filling up with the atmosphere of the organic solvent. In addition, it is possible to make the decompression with a low-powered vacuum pump.

According to the second feature to the fourth feature of the invention, since the arrangement allows the interior of the drying chamber to be further sealed up, it is possible to reduce the wall thickness of the drying chamber and reduce the power of the vacuum pump required for the decompression.

According to the fifth feature of the invention, since the processing liquid stored in the processing bath is the deaerated rinse, it is possible to prevent the surface of the object from being oxidized.

According to the sixth feature of the invention, since the blowing means for blowing the inert gas against the object on transportation from the processing bath to the drying chamber also serves to dry the object, the drying process can be accomplished more effectively. Further, according to the seventh feature, owing to the cooled inert gas, it is possible to promote the condensation of organic solvent in the drying chamber.

According to the eighth feature of the present invention, since the inert gas is blown against the object in the drying chamber while decompressing the drying chamber, it is possible to dry the object more effectively.

According to the ninth feature of the present invention, as the temperature of the drying chamber can be elevated by the panel heater, it is possible to dry the object more effectively.

Further, according to the tenth feature, owing to the use of the cooled rinse, it is possible to promote the condensation of organic solvent in the drying chamber.

According to the eleventh feature of the invention, after the object has been transported from the processing bath to the drying chamber, the opening is then closed to shelter the space and thereafter, the object is subjected to the drying process. Thus, the object has no possibility of receiving a bad influence from the chemical treatment during the drying process. Further, since the forthcoming process in the next processing bath can be prepared while the drying process is executed, it is possible to improve throughput of the cleaning apparatus. Additionally, since the arrangement allows the drying chamber and the processing bath to be designed under respective conditions independent of each other, it is possible to optimize the cleaning process and further miniaturize the cleaning apparatus because of the enhanced degree of freedom in the process design. Moreover, since the above-mentioned arrangement allows the volume of the drying chamber to be reduced, it is possible to reduce the wall thickness of the drying chamber and the processing bath when it is required to decompress the drying chamber while filling up with the atmosphere of the organic solvent. In addition, it is possible to make the decompression with the low-powered vacuum pump.

According to the twelfth and thirteenth features of the invention, since the drying chamber and the processing bath can be filled up with the atmosphere of the inert gas early or throughout the whole processes, it is possible to prevent the object from being oxidized.

According to the fourteenth and fifteenth feature of the invention, when the object to be processed enters into the drying chamber, the water on the object is removed to some extent. Moreover the rest of the water on the object is easily replaced with organic solvent. Accordingly, it is possible to carry out the drying process more effectively.

According to the sixteenth and seventeenth features of the invention, it is possible to separate the drying chamber from the processing bath more clearly. Thus, the object has no possibility of receiving a bad influence from the chemical treatment during the drying process. Additionally, since the arrangement allows the drying chamber and the processing bath to be designed under respective conditions independent of each other, it is possible to carry out the cleaning process rapidly and further miniaturize the cleaning apparatus because of the enhanced degree of freedom in the process design.

According to the eighteenth and nineteenth features of the invention, since the arrangement allows the interior of the drying chamber to be further sealed up, it is possible to reduce the wall thickness of the drying chamber and reduce the power of the vacuum pump required for the decompression.

According to the twentieth feature of the invention, since the drying chamber has been already filled up with the atmosphere of organic solvent before transporting the object into the drying chamber, it is possible to carry out the drying process more effectively.

Further, according to the twenty-first feature, owing to the use of the cooled rinse, it is possible to promote the condensation of organic solvent in the drying chamber.

The above and other features and advantages of this invention will become apparent, and the invention itself will best be understood, from a study of the following description and appended claims, with reference had to the attached drawings showing a preferred embodiment of the invention.

BRIEF DESCRIPTION OF THE DRAWINGS

FIG. 18 is a schematic view showing the operation of the cleaning unit of FIG. 4, corresponding to a step 1403 of FIG. 15;

FIG. 19 is a schematic view showing the operation of the cleaning unit of FIG. 4, corresponding to a step 1404 of FIG. 15;

FIG. 22 is a schematic view showing the operation of the cleaning unit of FIG. 4, corresponding to a step 1410 of FIG. 15;

FIG. 23 is a schematic view showing the operation of the cleaning unit of FIG. 4, corresponding to a step 1411 of FIG. 15;

FIG. 26 is a schematic view showing the operation of the cleaning unit of FIG. 4, corresponding to a step 1416 of FIG. 15;

FIG. 27 is a schematic view showing the operation of the cleaning unit of FIG. 4, corresponding to a step 1417 of FIG. 15;

DESCRIPTION OF THE PREFERRED EMBODIMENT

One embodiment of the present invention will be described with reference to drawings.

Figure 1:
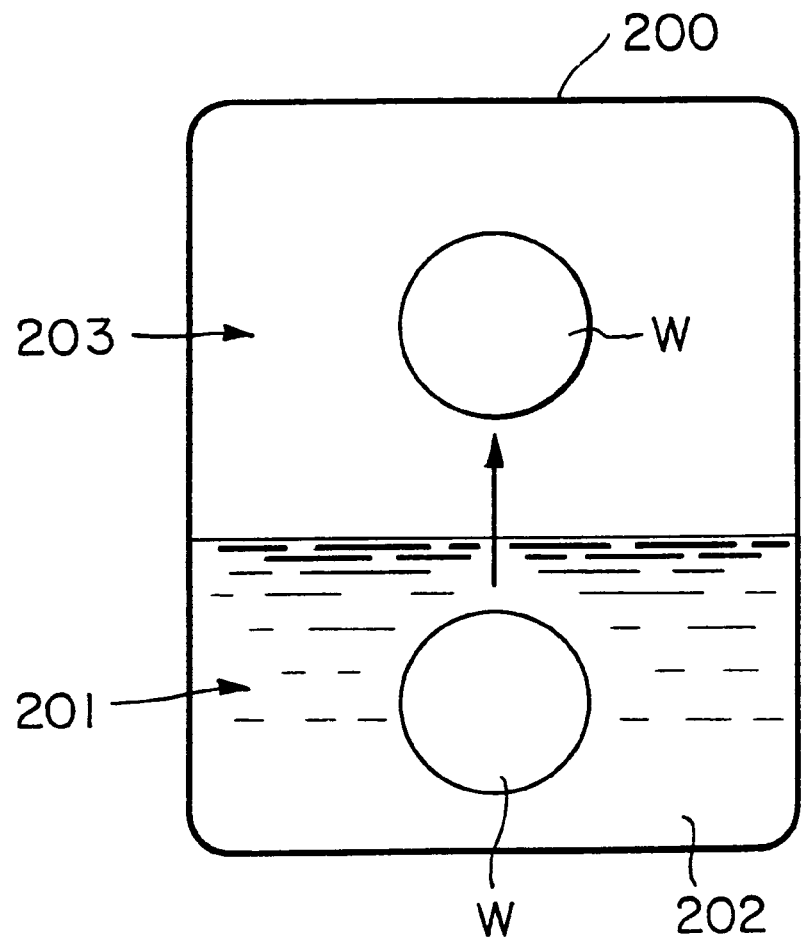
FIG. 1 is a schematic view of a conventional cleaning apparatus.
Figure 2:
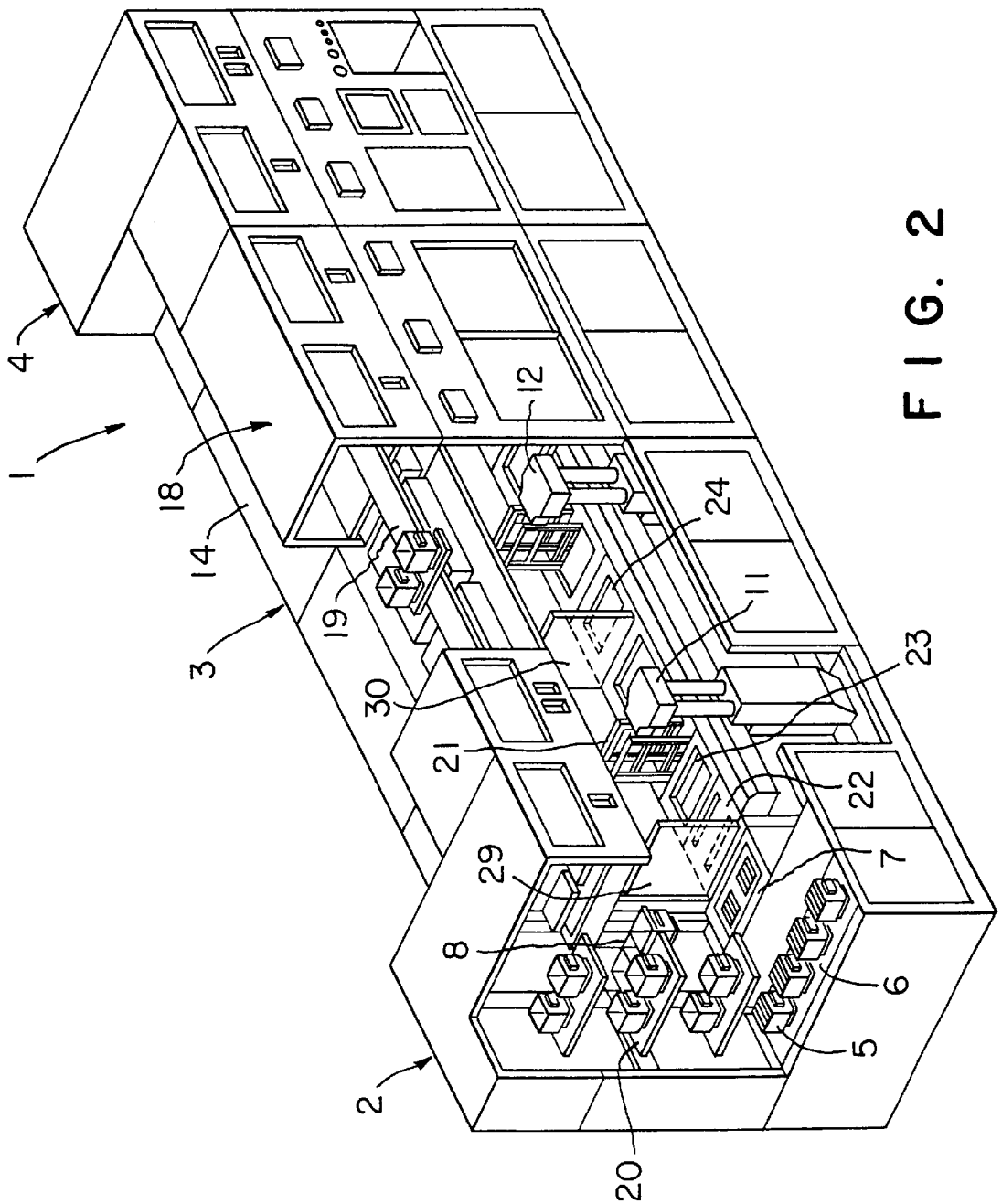
FIG. 2 is a cleaning apparatus for semiconductor wafers, in accordance with one embodiment of the present invention.
Figure 3:
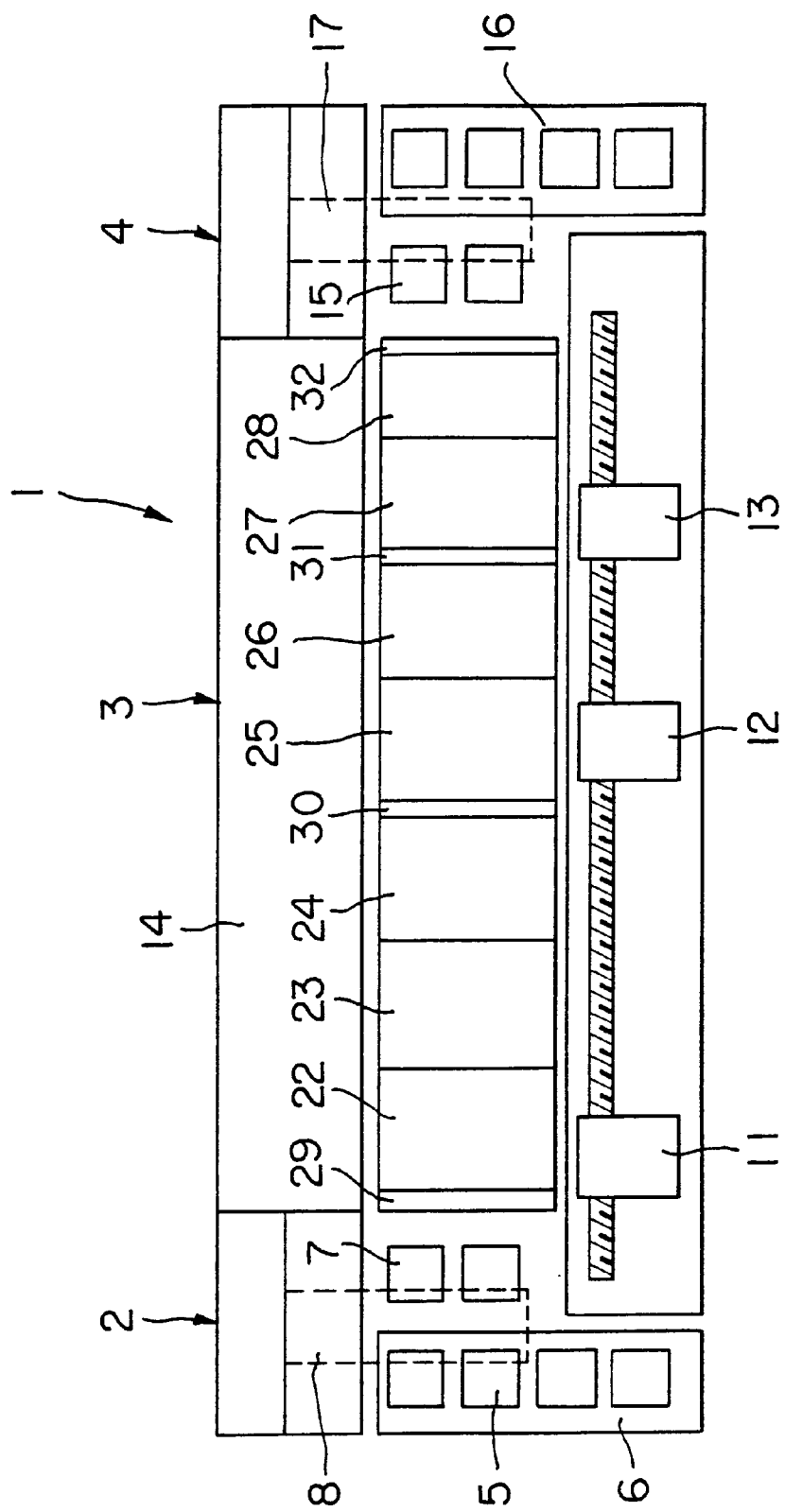
FIG. 3 is a plan view of the cleaning apparatus of FIG. 2.

First of all, we now describe a cleaning apparatus for cleaning semiconductor wafers, as an example to which the invention is applied. Note, through the description, the semiconductor wafer(s) will be also referred to as "wafer (s)", hereinafter. As shown in FIGS. 2 and 3, the whole cleaning apparatus 1 comprises a loading section 2 for accommodating the wafers before cleaning in blocks of carriers, a cleaning section 3 for cleaning the wafers, and an unloading section 4 for picking up the wafers after cleaning and dried in the section 3 into the carriers C every predetermined number of in blocks of cassettes. Thus, the cleaning apparatus 1 of the embodiment is constituted by three processing zones.

Arranged in the loading section 2 are a stand-by part 6 which causes carriers 5 having a predetermined number (e.g. twenty-five sheets) of precleaning wafers accommodated therein to stand by and a loader part 7 which carries out a picking-up operation of the wafers from the carriers 5, an aligning operation of respective orientation flats of the wafers, and a counting operation for the number of wafers. Further, the loading section 2 is provided with a transfer arm 8 which transports the carriers 5, which have been loaded from the outside by a transporting robot etc., to the stand-by part 6 and also between the stand-by part 6 and the loader part 7.

In the cleaning section 3, three wafer transfer units 11, 12, 13 are arranged on the front side (this side in FIG. 2) of the section 3, while a piping area 14 is defined on the back side of the section 3 through partition walls, for housing various tanks for reserving processing liquids, such as chemicals, and various pipes.

On the other hand, the unloading section 4 includes an unloader part 15 for accommodating the wafers cleaned in the cleaning section 3 in the carriers 5, a stand-by part 16 for causing the carriers 5 with the wafers to stand by, and a transfer arm 17 for transporting the carriers 5 between the unloader part 16 and the stand-by part 17.

Note, the cleaning apparatus 1 further includes a carrier transfer section 18 which transports the carriers 5 emptied in the loading section 2. The carrier transfer section 18 is equipped with a carrier conveyer 19 arranged above the cleaning section 3, a carrier stock section 20 for receiving the emptied carriers 5 from the loader part 7 of the loading section 2 by means of the transfer arm 8 and stocking the carriers 5 with and without the wafers, and a not-shown delivering part which receives the emptied carriers 5 from the carrier conveyer 19 by means of the transfer arm 17 at the unloading section 4 and delivers the emptied carriers 5 to the unloader part 15.

The cleaning section 3 is provided with the following baths in order from the side of the loader part 7: a chuck cleaning/drying bath 22 for cleaning and drying a wafer chuck 21 of the wafer transfer unit 11; a chemical cleaning bath 23 for removing impurities, such as organic contaminants, metallic impurities particles or the like, on the surface of the wafer by using chemicals, such as ammonium hydrogen peroxide ($NH_4OH/H_2O_2/H_2O$); a wash cleaning bath 24 for cleaning the wafers cleaned in the bath 23 by e.g. pure water; a chemical cleaning bath 25 for removing metallic contaminations on the wafers by a chemical, such as a mixture of $HCl/H_2O_2/H_2O$; a wash cleaning bath 26 for cleaning the wafers cleaned in the bath 25 by e.g. pure water; and a cleaning unit 27 of the invention for removing an oxide on the wafers by a chemical (e.g. a mixture of $HF/H_2O$), cleaning the washed wafers by the rinse (e.g. pure water) and drying the cleaned wafers; and a chuck cleaning and drying bath 28 for cleaning and drying not-shown wafer chucks of the wafer transfer unit 13.

Note, partition plates 29, 30, 31, 32 are interposed between the loader part 7 and the chuck cleaning/drying bath 22, between the wash cleaning bath 24 and the chemical cleaning bath 25, between the wash cleaning bath 26 and the cleaning unit 27, and between the chuck cleaning and drying bath 28 and the unloader part 15, respectively. These partition plates 29, 30, 31, 32 are adapted so as to open upward and shut downward in receiving and delivering the wafers by driving mechanisms which are not shown in the figures. Owing to the provision of the partition plates 29, 30, 31, 32, it is possible to prevent the atmosphere of the chemicals from diffusing into the adjoining spaces.

We now describe structure of the cleaning unit 27 with reference to FIGS. 4 to 14. The cleaning unit 27 includes a cleaning bath 41 as a processing bath reserving the processing liquids of chemicals (e.g. mixture of $HF/H_2O$) and the rinse (e.g. pure water) and immersing the wafers to be processed in the liquids, and a cylindrical drying chamber 42 arranged above the cleaning bath 41 to drying the wafers W transported from the cleaning bath 41.

The cleaning bath 41 accommodates a wafer guide 43 and e.g. fifty sheets of wafers W carried by the wafer guide 43. Further, the cleaning bath 41 is provided, on both sides of a bottom thereof, with nozzles 44, 45 for ejecting the processing liquid for the wafers W accommodated therein. The nozzles 44, 45 may be constituted by pipes each of which has respective injection orifices formed at each interval equal to a distance between the adjoining wafers W along the direction of the wafers' arrangement. Into the nozzles 44, 45, either one of the chemical (e.g. mixture of $HF/H_2O$) and the rinse such as pure water (DIW: deionized water) is supplied from the piping area 14 shown in FIGS. 2 and 3 by a switching operation of a switching valve 46. The switching operation of the switching valve 46 is controlled by a not-shown controller at predetermined timing. Note, in order to prevent the oxidation of the wafers W, it is preferable to use the deaerated DIW as the rinse.

Additionally, in the circumference of the cleaning bath 41, a collect bath 47 is provided for collecting the processing liquid overflowing the cleaning bath 41. The processing liquid collected by the collect bath 47 is adapted so as to circulate in the nozzles 44, 45 through a switching valve 48, a pump 49, a filter 50 and a switching valve 51. In the switching valve 48, it is set whether to circulate the processing liquid collected by the collect bath 47 in the above-mentioned manner or to discharge the liquid. In the switching valve 51, it is set whether to circulate the processing liquid collected by the collect bath 47 or to supply the DIW to the nozzles 44, 45, which has been cooled to the 0— a normal temperature (°C.) degree range, more preferably 5° C., by a cooler. Note, a damper 52 is disposed between the pump 49 and the filter 50. At the lowermost part of the cleaning bath 41, an exhaust port 53 is arranged to drain the processing liquid. In the switching valve 54, it is set whether to drain the processing liquid through the exhaust port 53 or not.

The drying chamber 42 is provided, on upper and lower parts thereof, with rectangular upper and lower openings 61, 62 for receiving and delivering the wafers W, respectively. A closed lid 63 is laid on the upper opening 61, while a slide door arrangement 64 and a rotary door arrangement 60 are provided at the lower opening 62.

Figure 6:
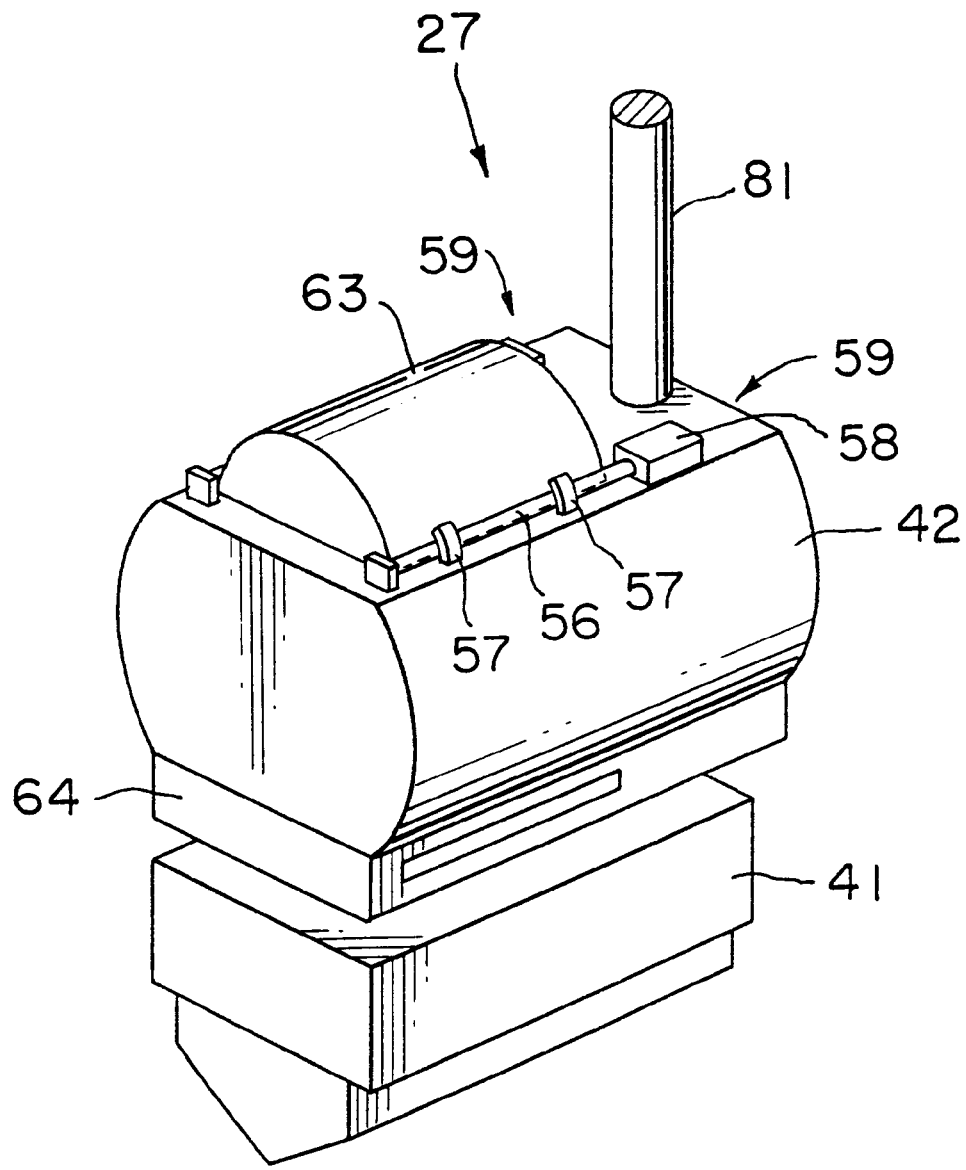
FIG. 6 is a perspective view of the cleaning unit of FIG. 4.
Figure 7:
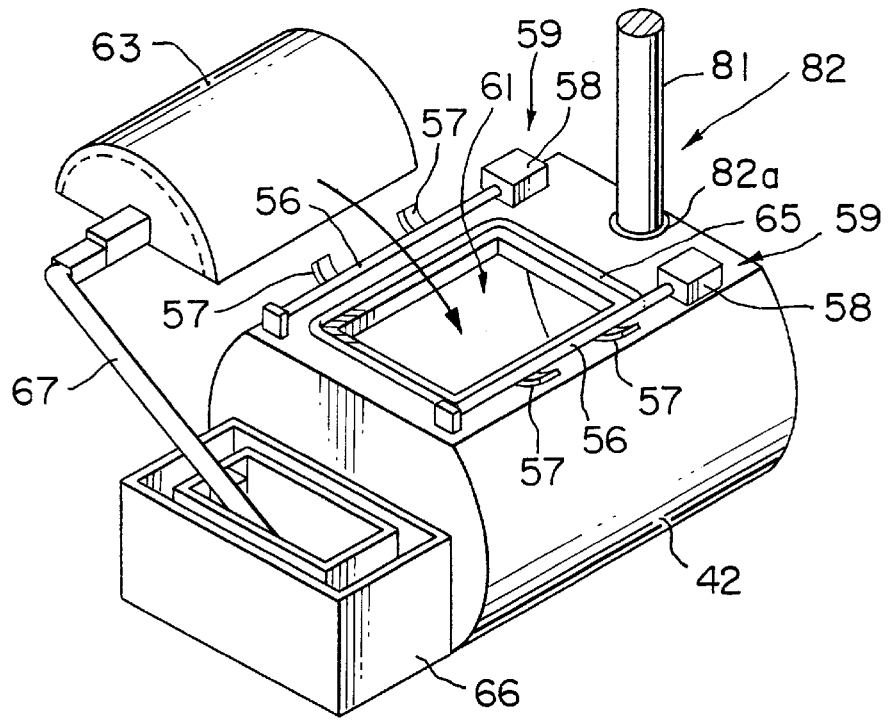
FIG. 7 is a perspective view showing the vicinity of an upper lid of the cleaning unit of FIG. 4.

The lid 63 is made of resin, such as PVC (polyvinyl chloride) and PP (polypropylene) etc., and shaped like a semi-cylinder at both of the interior and exterior, as shown in FIG. 6. Thus, such a formation of the lid 63 causes the interior of the drying chamber 42 closed by the lid 63 to be defined substantially cylindrically, while preventing a stream of nitrogen gas etc. blown against the wafers W from being turbulent. Consequently, the nitrogen gas or the like can be blown against the respective wafers W uniformly. Additionally, as shown in FIG. 7, an O-ring 65 is arranged around the periphery of the upper opening 61 and furthermore, a pair of lid fixing mechanisms 59 are disposed on both sides of the upper opening 61, for depressing the lid 63 closing the upper opening 61 securely. With such an arrangement, it is possible to enhance the sealing capability of the chamber 41 under condition that the upper opening 61 is closed by the lid 63. Provided at two positions of each rotatable rod 56 of the fixing mechanism 59 are junction plates 57 which are engageable with the lid 63 closing the upper opening 61. In operation, when respective rotary driving units 58 operate to rotate the rods 56 respectively, the junction plates 57 are brought into contact with the lid 63, so that it is urged against the periphery of the opening 61 firmly.

Figure 8:
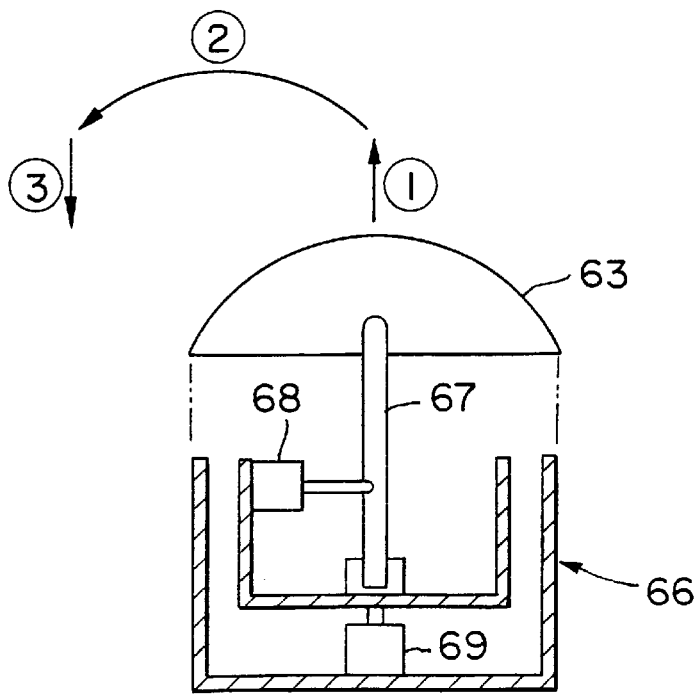
FIG. 8 is a view showing a schematic structure of a lid driving section of the cleaning unit of FIG. 4.

Arranged in the vicinity of the drying chamber 42 is a lid actuator 66 which drives to open and shut the lid 63. As shown in FIG. 8, the lid actuator 66 includes a cylinder 68 for rotating a pivot arm 67 having an end fixed to the lid 63, and another cylinder 69 for moving the lid 63 and these rotating arrangements (the cylinder 68, the arm 67) upward and downward. In operation for opening the lid 63, the lid actuator 66 firstly moves the lid 63 closing the upper opening 61 upward (see ① of FIG. 8). Subsequently, the lid actuator 66 further rotates the lid 63 to a position apart from the upper opening 61 (see ② of FIG. 8) and moves the lid 63 downward (see ③ of FIG. 8). In this way, the upper opening 51 is opened. On the contrary, when it is required to close the upper opening 61 by the lid 63, the above-mentioned operations will be executed in reverse order (i.e. ③→②→① of FIG. 8).

Figure 9:
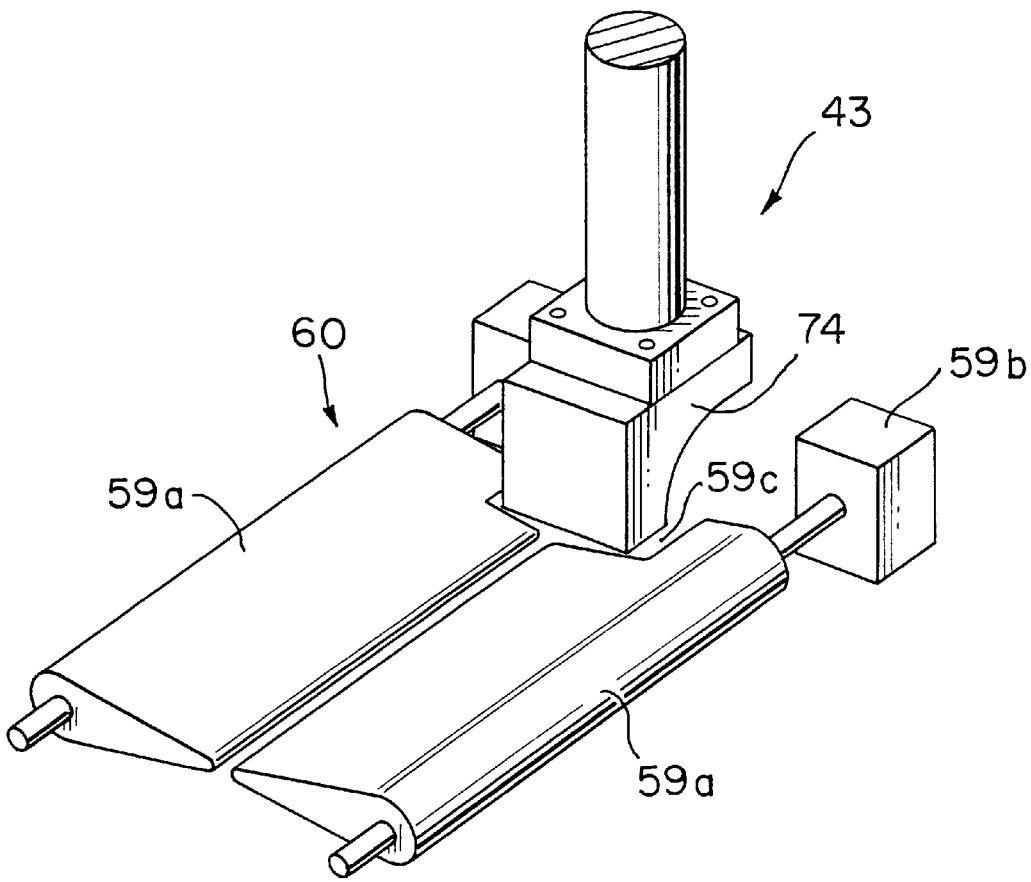
FIG. 9 is a perspective view showing a rotary door arrangement of the cleaning unit of FIG. 4.

As shown in FIG. 9, the rotary door arrangement 60 comprises a pair of rotary doors 59a rotatably arranged therein and rotary driving units 59b for rotating the rotary doors 59a respectively. Each rotary door 59a is provided with a notch 59c which defines an opening allowing a carrying member 74 (described later) of the wafer guide 43 retaining the wafers W to pass therethrough while that the rotary doors 59a are closed. The rotary doors 59a are made of resin, such as PVC (polyvinyl chloride), PP (polypropylene) or the like in the same way as the lid 63.

Figure 10:
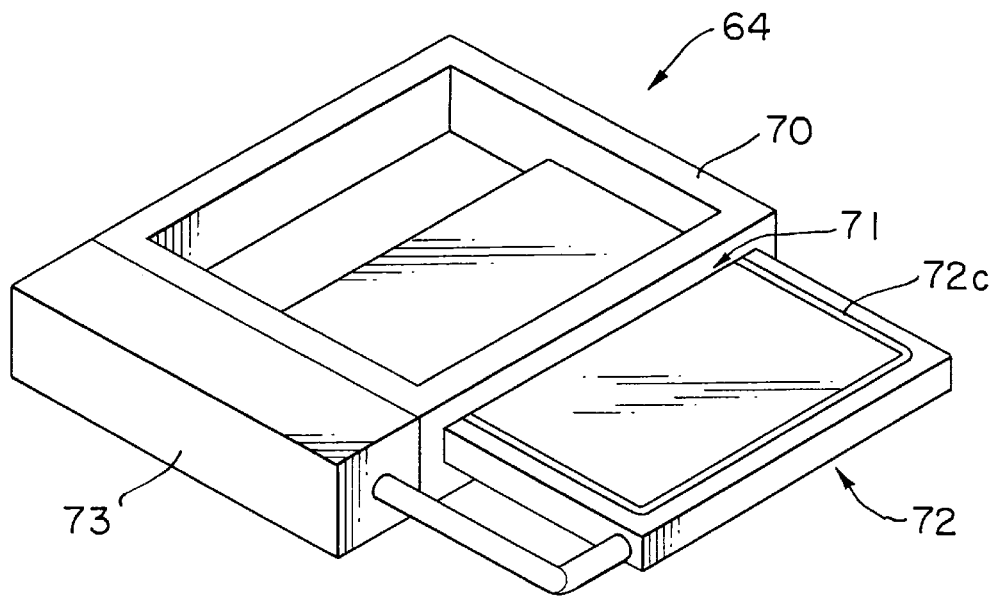
FIG. 10 is a perspective view showing a slide door arrangement of the cleaning unit of FIG. 4.
Figure 11:
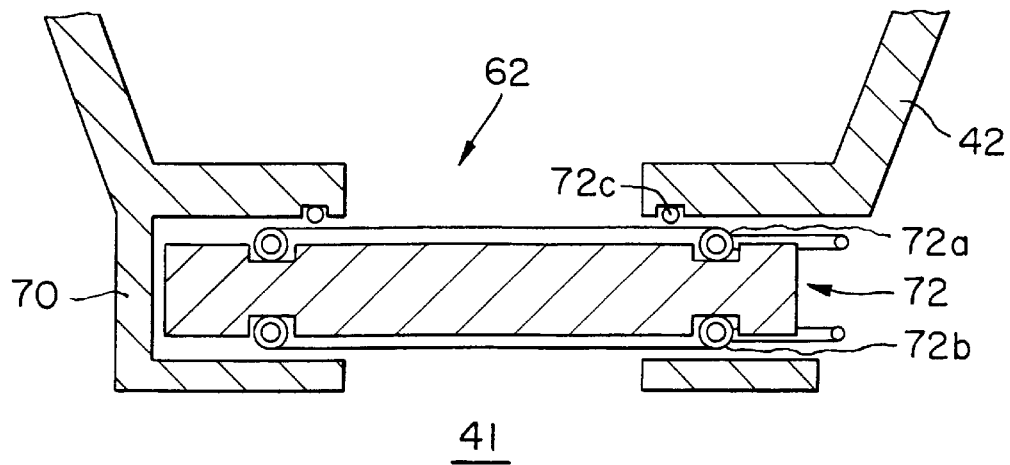
FIG. 11 is a longitudinal cross sectional view showing the slide door arrangement of FIG. 10.

As shown in FIG. 10, the slide door arrangement 64 comprises a rectangular flange 70 disposed between the cleaning bath 41 and the drying chamber 42, a slide door 72 inserted into an opening 71 formed in the flange 70 to open and close an interior of the flange 70, and a cylinder 73 for driving the slide door 72. Similar to the lid 63, the slide door 72 is made of resin, such as PVC (polyvinyl chloride) and PP (polypropylene) etc., and rectangular-shaped similarly to the lower opening 62. Further, as shown in FIG. 11, respective air grip seals 72a, 72b are arranged along outer peripheries on both sides of the slide door 72, while an O-ring 72c is arranged on a bottom face of the drying chamber 42 so as to extend along an inner side of the air grip seal 72a. In the modification, the O-ring 72c may be arranged along an outside of the air grip seal 72a. In operation, under condition that the slide door 72 is accommodated in the flange 70, both air grip seals 72a, 72b are inflated so as to come into tight contact with the bottom face of the drying chamber 42 and a bottom face of the flange 70, respectively. Subsequently, the O-ring 72c is brought into contact with the surface of the slide door 72 tightly. In this way, the lower opening 62 is closed tightly.

Figure 12:
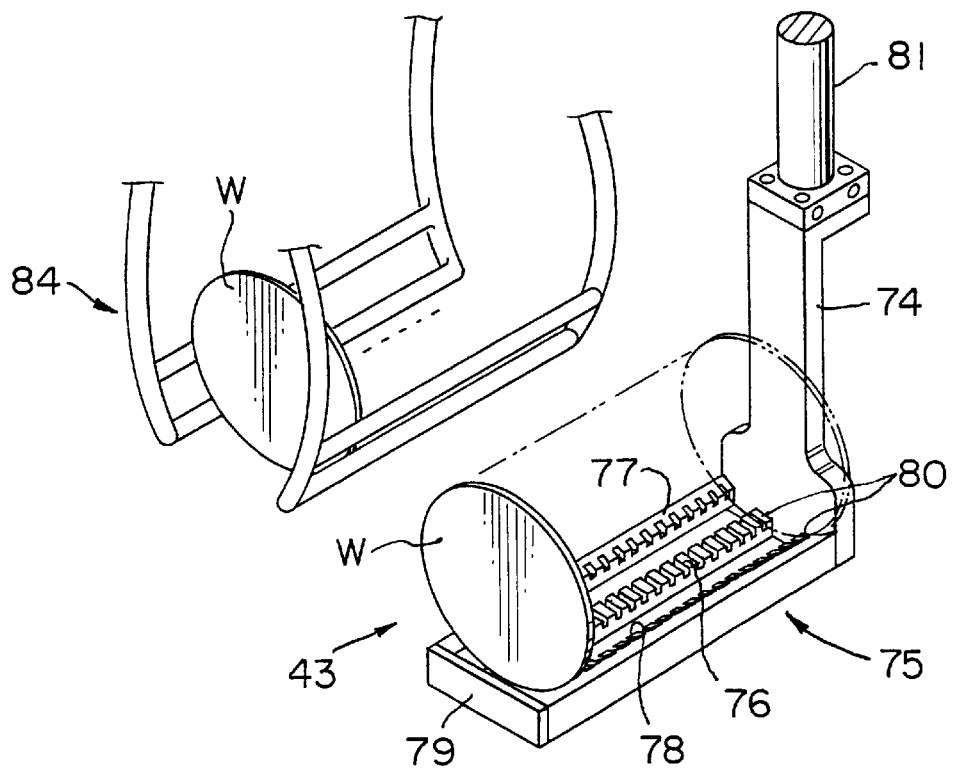
FIG. 12 is a perspective view showing a wafer guide of the cleaning unit of FIG. 4.

As shown in FIG. 12, the wafer guide 43 is provided, at an lower end of the carrying member 74 thereof, with a wafer support 75 for supporting a plurality of wafers W (e.g. 50 sheets). The wafer support 75 consists of an intermediate supporting rod 76 and two lateral supporting rods 77, 78 arranged in parallel with each other on both sides of the rod 76. Respective ends of the rods 76, 77, 78 are fixed with a lower end of the carrying member 74, while the other ends of the rods 76, 77, 78 are secured to a fixing member 79. Each of the rods 76, 77, 78 has a plurality of retaining grooves 80, 80 . . . , 80 (e.g. fifty grooves) formed at predetermined intervals in the longitudinal direction. The wafer guide 43 is made of materials exhibiting superior characteristics in corrosion resistance, heat resistance and durability, for example, PEEK (polyether ether ketone), Qz (quartz) and so on.

Figure 5:
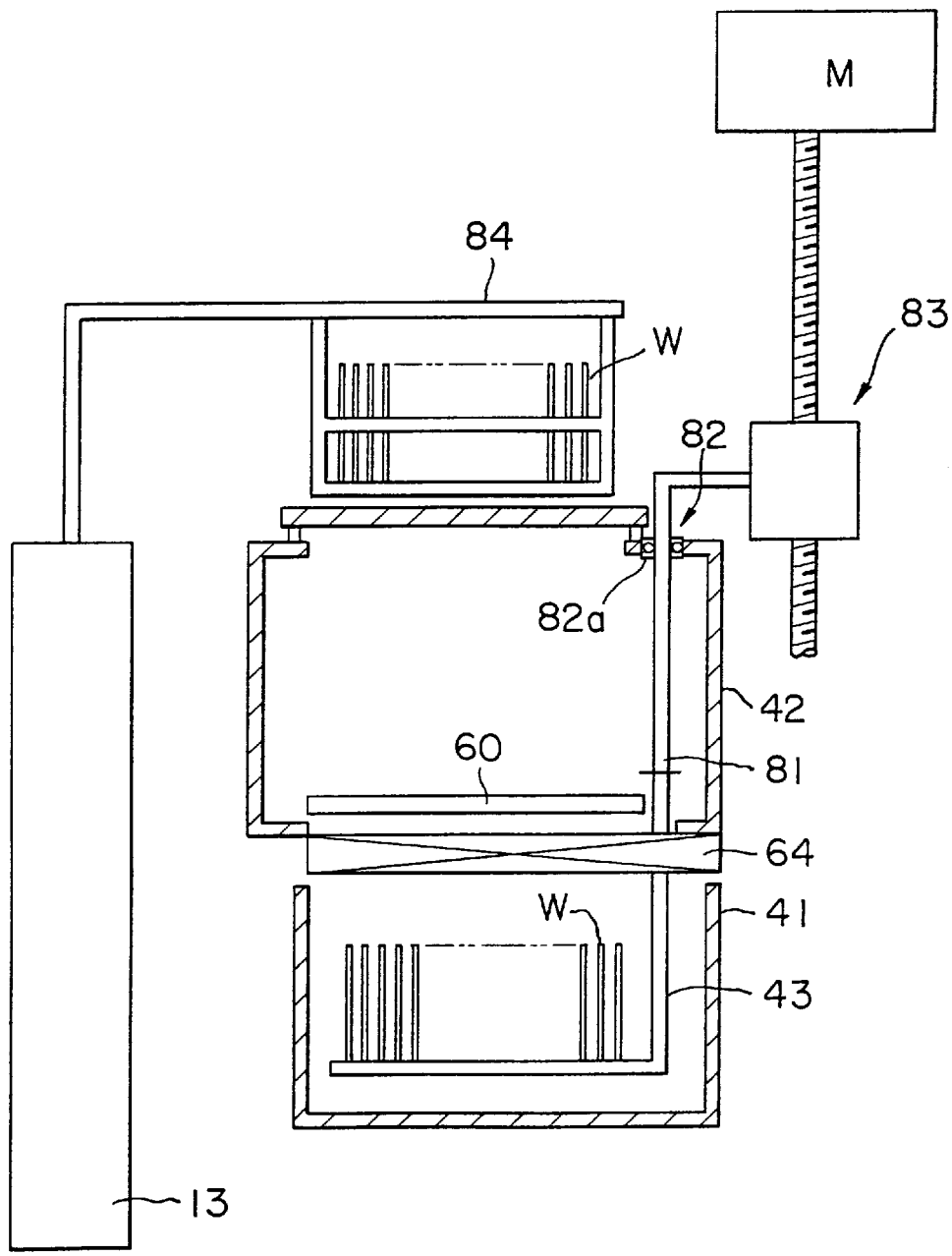
FIG. 5 is another longitudinal cross sectional side view of the cleaning unit of FIG. 4.

A guide elevating rod 81 is fixed to an upper end of the wafer guide 43. As shown in FIGS. 5 and 7, the guide elevating rod 81 is adapted so as to move upward and downward, projecting to the outside through a gripping mechanism 82 arranged on the top of the drying chamber 42. The gripping mechanism 82 includes an air grip seal 82a surrounding the guide elevating rod 81. When driving the guide elevating rod 81 up and down, air is released from the air grip seal 82a. On the contrary, when it is required to close the drying chamber 42, the air grip seal 82a is inflated.

The upper end of the guide elevating rod 81 is connected with a wafer-guide Z-axis mechanism 83 arranged behind the drying chamber 42. Since the wafer-guide Z-axis mechanism 83 operates to move the guide elevating rod 81 up and down, the wafers W carried by the wafer guide 43 are transported between the cleaning bath 41 and the drying chamber 42 through the lower opening 62. Further, as shown in FIG. 5, the wafer transfer unit 13 (see FIG. 3) is arranged in front of the cleaning unit 27. In operation, a wafer chuck 84 provided on the wafer transfer unit 13 receives, for example, fifty sheets of wafers W from the neighboring wash cleaning bath 26 and delivers them to the wafer guide 43 in the drying chamber 42. Furthermore, the wafer chuck 84 receives, for example, fifty sheets of wafers W from the wafer guide 43 in the drying chamber 42 and delivers them to the unloader part 15 of the unloading section 4.

Figure 4:
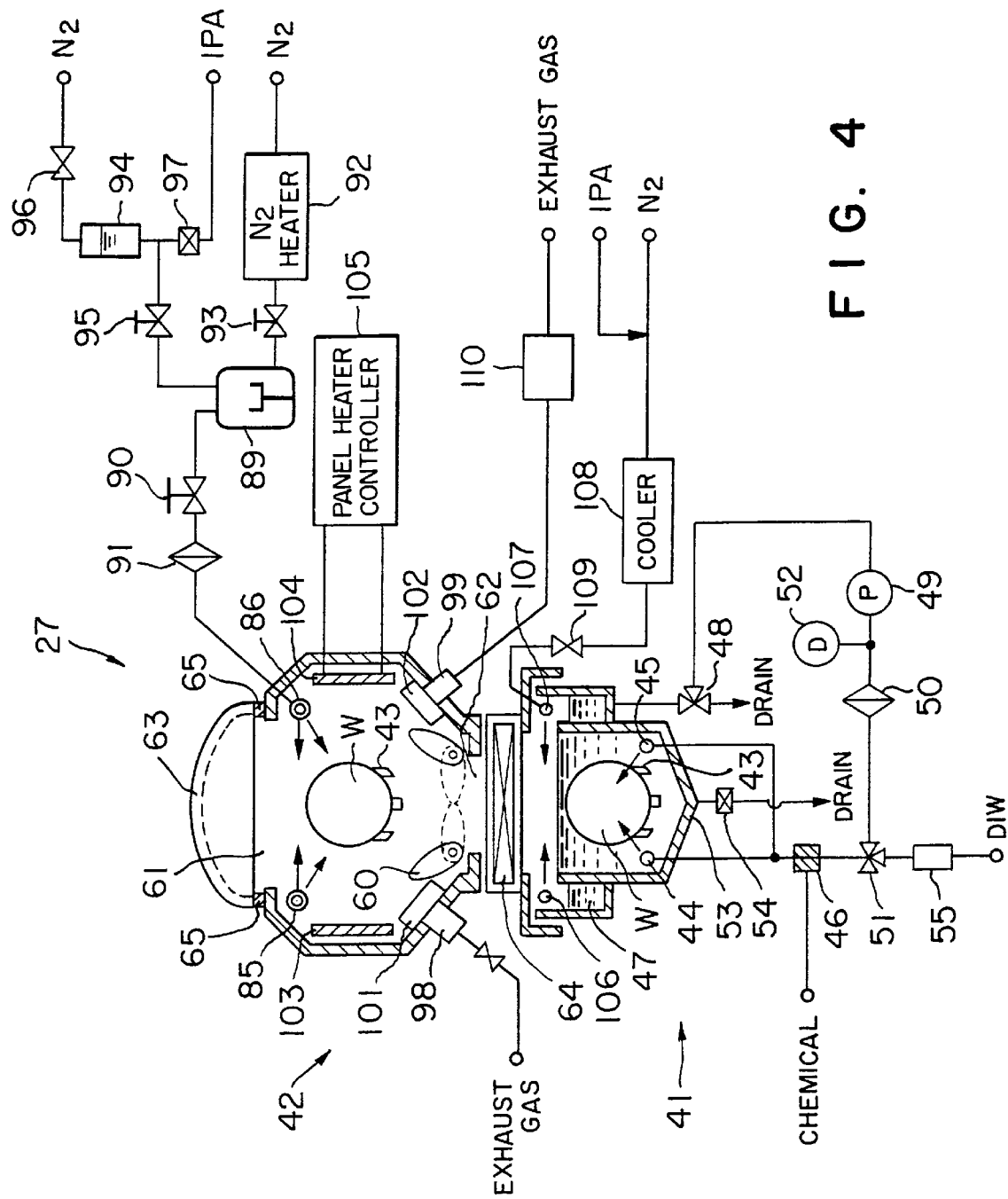
FIG. 4 is a longitudinal cross sectional front view of a cleaning unit of the cleaning apparatus of FIG. 2.
Figure 13:
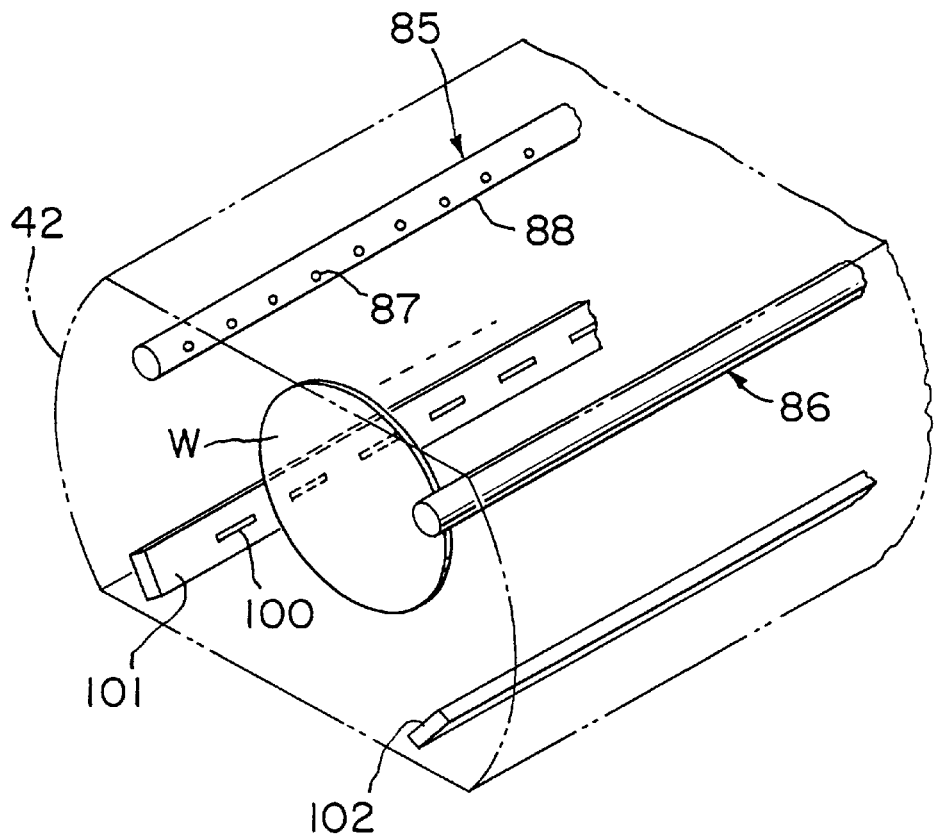
FIG. 13 is a perspective view showing nozzles and exhaust ports of the cleaning unit of FIG. 4.
Figure 14:
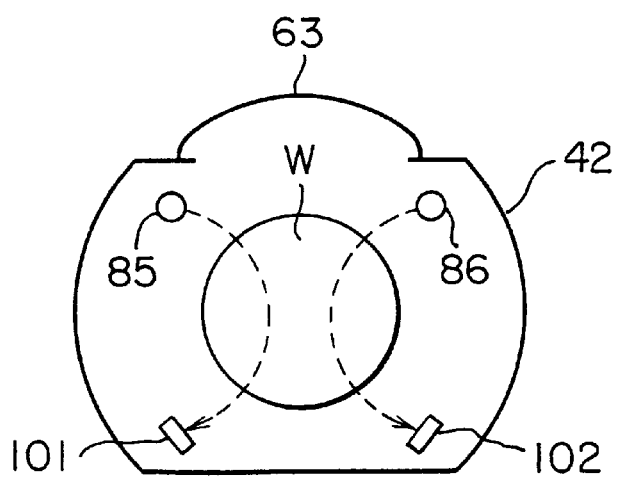
FIG. 14 is a view for explanation of an operation of rectifying plates of the cleaning unit of FIG. 4.

As shown in FIGS. 4 and 13, on both sides of the upper part of the drying chamber 42, two nozzles 85, 86 are arranged so as to blow the nitrogen gas etc. over the wafers W carried by the wafer guide 43 in a downward-flowing manner. The nozzles 85, 86 are constituted by pipes 88 having injection holes 87 formed at regular intervals each of which is identical to the distance between the adjoining wafers W in the direction of the wafers' arrangement. Into the nozzles 85, 86, a mixed gas composed of the IPA and heated nitrogen gas is supplied from an IPA evaporator 89 through a control valve 90 and a filter 91. Into the IPA evaporator 89, the heated nitrogen gas is supplied from a nitrogen heater 92 through a control valve 93, while the IPA is also supplied from an IPA tank 94 through a control valve 95. Similarly, the nitrogen is supplied to the IPA tank 94 through a control valve 96, while the IPA is also supplied to the IPA tank 94 through a control valve 97.

On the other hand, as shown in FIGS. 4 and 13, the drying chamber 42 is provided, on both sides of the lower part, with exhaust ports 98, 99 for discharging the nitrogen gas etc. blown out of the nozzles 85, 86. The exhaust ports 98, 99 are communicated with a not-shown exhaust pump. Also communicated with the exhaust ports 98, 99 are respective rectifying plates 101, 102 as rectifying means, which having a plurality of inlets 100, 100, . . . , 100 for sucking the nitrogen gas etc., which have been blown out of the nozzles 85, 86, through respective parts at the lower part of the drying chamber 42 uniformly. With the arrangement, as shown by dotted lines of FIG. 14, the nitrogen gas etc., is blown out of the injection holes 87 of the nozzles 85, 86, flows on the surfaces of the wafers W and is subsequently sucked from the inlets 100 of the rectifying plates 101, 102. Thus, owing to the above-mentioned flow of the nitrogen gas etc., it is possible to prevent the occurrence of turbulence in the flows of the nitrogen gas etc. Note, the drying chamber 42 is also provided, at the lower part, with a drain port (not shown) for discharging the liquids.

Again in FIG. 4, a pair of panel heaters 103, 104 are arranged on both sides of a center of the drying chamber 42. These panel heaters 103, 104 are electrically connected to a panel heater controller 105 for controlling the temperature in the chamber 42. In this way the temperature of the chamber 42 is maintained to the extent that, for example, the IPA boils.

As shown in FIG. 4, provided between the cleaning bath 41 and the drying chamber 42, for example, on both sides of a space above the surface of the bath 41 are nozzles 106, 107 which blow the nitrogen gas against the wafers W during transporting from the bath 41 to the chamber 42. The structures of the nozzles 106, 107 are substantially similar to those of the above-mentioned nozzles 85, 86. Into the nozzles 106, 107, the cooled nitrogen gas is supplied through a cooler 108 for cooling the nitrogen gas to the 0—a normal temperature (° C.) degree range, more preferably 5° C., and a control valve 109.

Figure 15:
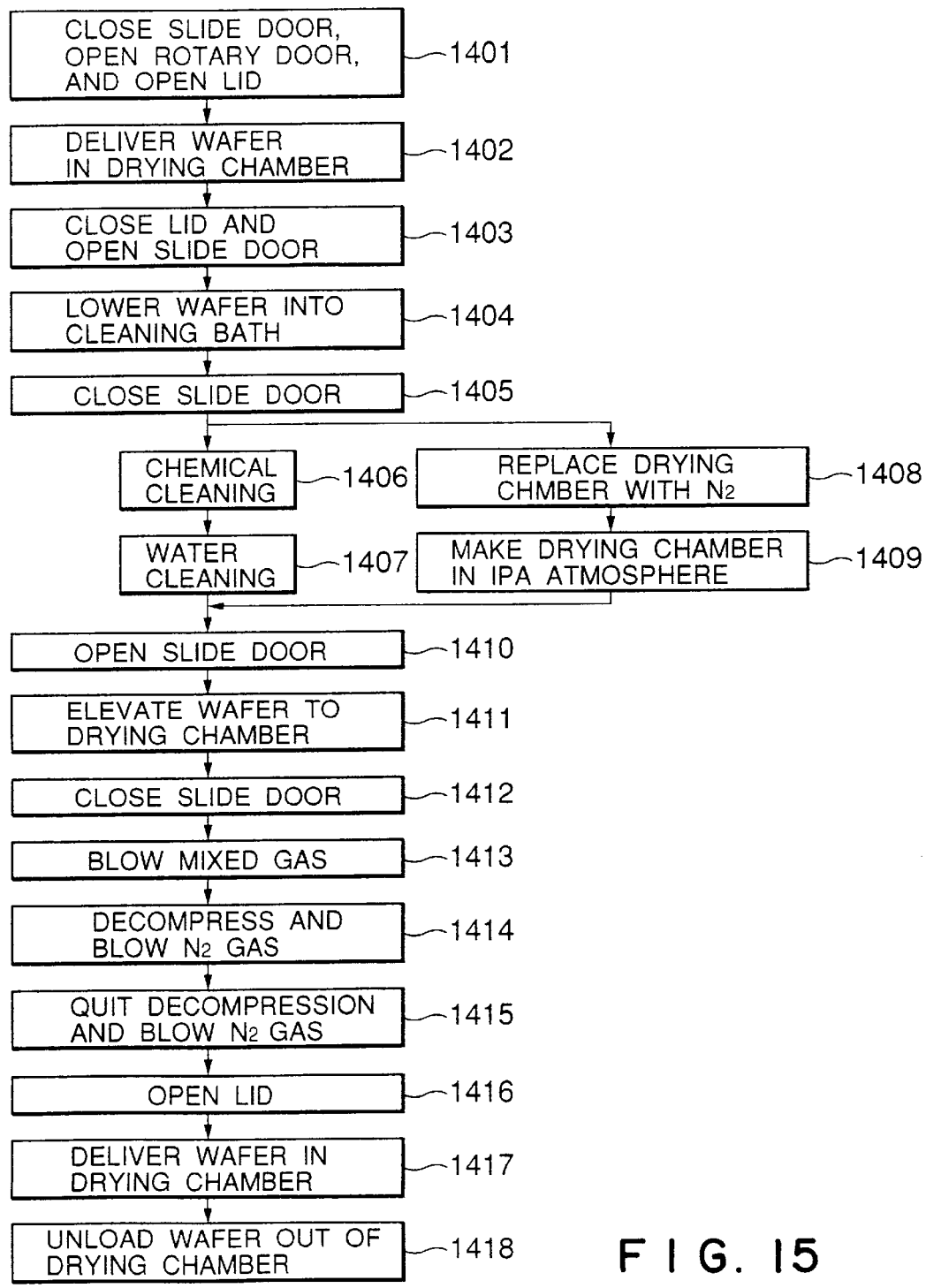
FIG. 15 is a flow chart of an operation of the cleaning unit of FIG. 4.

We now describe an operation of the cleaning apparatus 27 constructed above, in accordance with a flow chart of FIG. 15. Note, the following operational control is executed by a not-shown controller.

Figure 16:
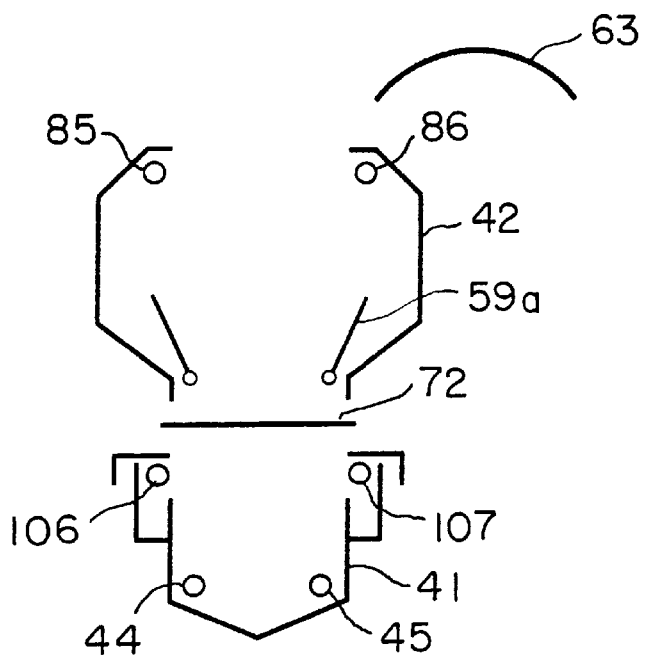
FIG. 16 is a schematic view showing the operation of the cleaning unit of FIG. 4, corresponding to a step 1401 of FIG. 15.
Figure 17:
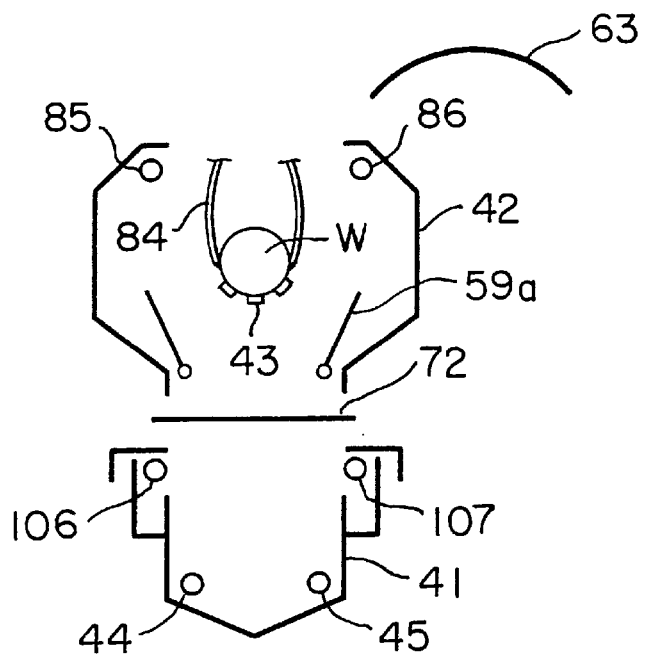
FIG. 17 is a schematic view showing the operation of the cleaning unit of FIG. 4, corresponding to a step 1402 of FIG. 15.

First of all, on condition that the slide door 72 at the bottom of the drying chamber 42 is closed while the rotary doors 59a are opened, the lid 63 on the top of the chamber 42 is opened (see step 1401, FIG. 16). Next, the wafer chuck 84 is lowered into the chamber 42, while the wafers W are delivered to the wafer guide 43 in the chamber 42 (see step 1402, FIG. 17).

Figure 20:
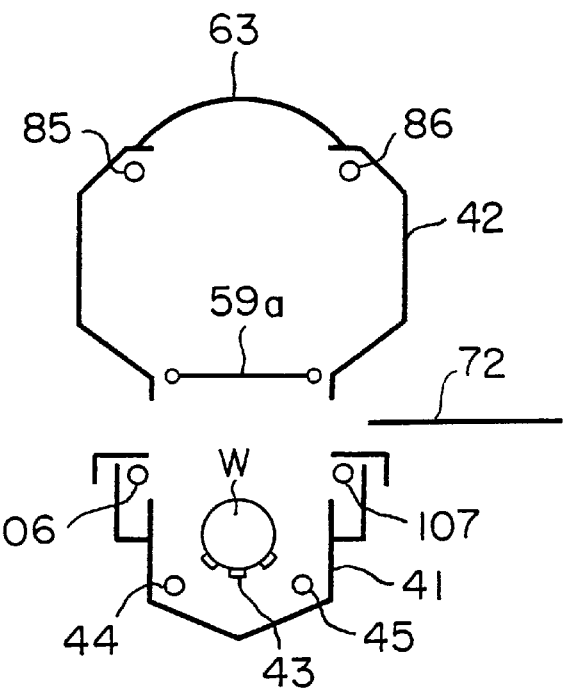
FIG. 20 is a schematic view showing the operation of the cleaning unit of FIG. 4, corresponding to a step 1405 of FIG. 15.

At sequent step 1403, it is executed to close the lid 63 on the top of the chamber 42 and open the slide door 72 at the bottom of the chamber 42 (see FIG. 18). Note, in the modification, the slide door 72 may be adapted so as to open from the beginning. Then, the wafer guide 43 carrying the wafers W is lowered to transfer them into the cleaning bath 41 (step 1404, FIG. 19) and the rotary doors 59a are closed in succession (step 1405, FIG. 20).

Thereafter, in the cleaning bath 41, it is executed to inject the mixture of HF/H$_2$O through the nozzles 44, 45 and subsequently immerse the wafers W into the reserved mixture of HF/H$_2$O for chemical cleaning (step 1406, FIG. 21). As a matter of course, the mixture of HF/H$_2$O ejected from the nozzles 44, 45 forms a convection directing the wafers W in the cleaning bath 41 thereby to promote the chemical cleaning. Hereat, the chemical liquid may be stored prior to the introduction of the wafers W into the cleaning bath 41.

Figure 21:
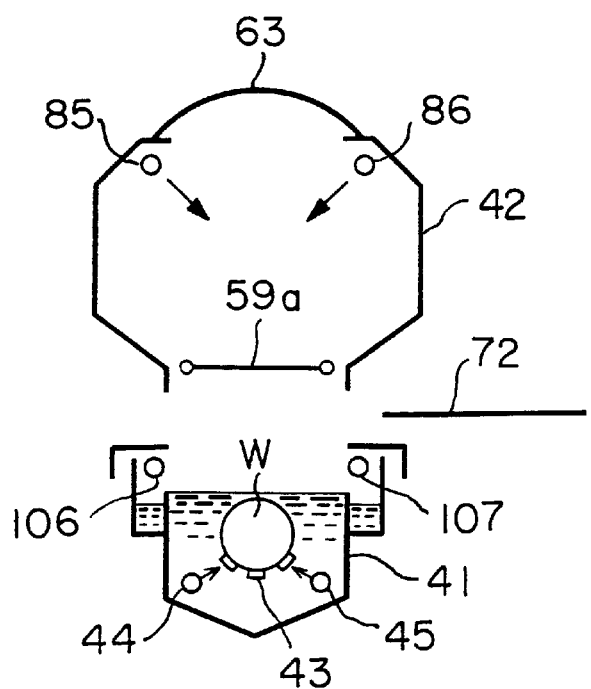
FIG. 21 is a schematic view showing the operations of the cleaning unit of FIG. 4, corresponding to steps 1406 to 1409 of FIG. 15.

Next, the mixture of $HF/H_2O$ is discharged and thereafter, the DIW is ejected from the nozzles 44, 45 to rinse the wafers W (step 1407, FIG. 21). As well as the mixture of $HF/H_2O$, the DIW ejected from the nozzles 44, 45 forms a convection directing the wafers W in the cleaning bath 41 thereby to promote the rinsing process. Note, in the modification, the supply of DIW may be started without discharging the mixture of $HF/H_2O$ so that the density of the mixture becomes thin gradually.

On the other hand, while such a cleaning process is carried out, the nitrogen gas is blown out from the nozzles 85, 86 for interchange (step 1408, FIG. 21). Thereafter, the IPA or the mixture of the IPA and nitrogen is blown out from the nozzles 85, 86, so that the drying chamber 42 is filled up with the atmosphere of IPA (step 1409, FIG. 21).

Next, at step 1410, it is executed to open the rotary door 59a at the bottom of the drying chamber 42 (FIG. 22) and thereafter, the wafer guide 43 carrying the wafers W is elevated to transport them into the drying chamber 42 (step 1411, FIG. 23). During the transportation, the nitrogen gas is blown against the wafers W on transportation from the cleaning bath 41 to the drying chamber 42 by the nozzles 106, 107. Note, in order to drying the wafers W more effectively, the mixture of the nitrogen and IPA may be blown against the top of the cleaning bath 41 before or during opening the rotary doors 59a and sequent transporting the wafers W from the cleaning bath 41 to the drying chamber 42. Further, within a period between the transporting process of the wafers W from the drying chamber 42 to the cleaning bath 41 and the drying process of the cleaned wafers W in the drying chamber 42, the nitrogen gas may be blown into the cleaning bath 41 thereby to fill it with the atmosphere of nitrogen gas usually.

Figure 24:
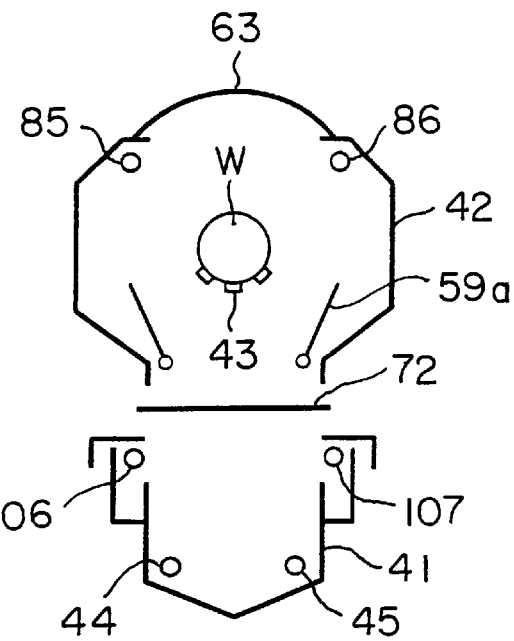
FIG. 24 is a schematic view showing the operation of the cleaning unit of FIG. 4, corresponding to steps 1412 and 1415 of FIG. 15.

Subsequently, upon closing the slide door 72 at the bottom of the drying chamber 42 (step 1412, FIG. 24), the IPA or the mixture of the IPA and nitrogen is blown from the nozzles 85, 86 to the wafers W in the drying chamber 42, downwardly (step 1413, FIG. 25). After that, the drying chamber 42 is exhausted to be decompressed, and at the same time, the nitrogen gas is blown from the nozzle 85, 86 downwardly to the wafers W in the drying chamber 42 (step 1414, FIG. 25). Note, in this case, the nitrogen gas may be blown without decompressing the drying chamber 42. Alternatively, the drying chamber 42 may be decompressed without blowing the nitrogen gas.

Figure 25:
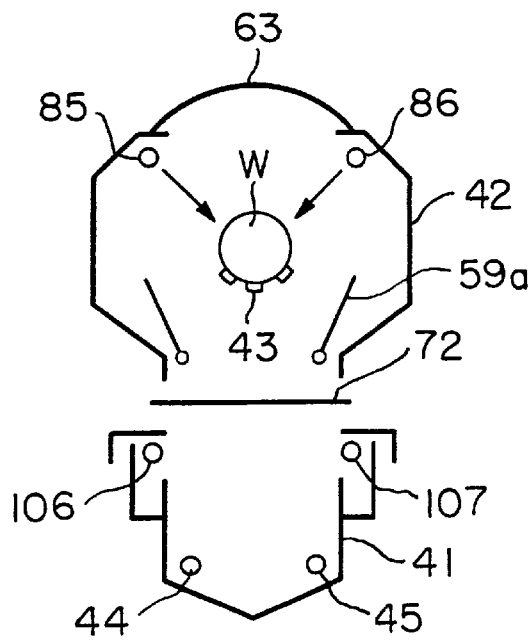
FIG. 25 is a schematic view showing the operation of the cleaning unit of FIG. 4, corresponding to steps 1413 and 1414 of FIG. 15.
Figure 28:
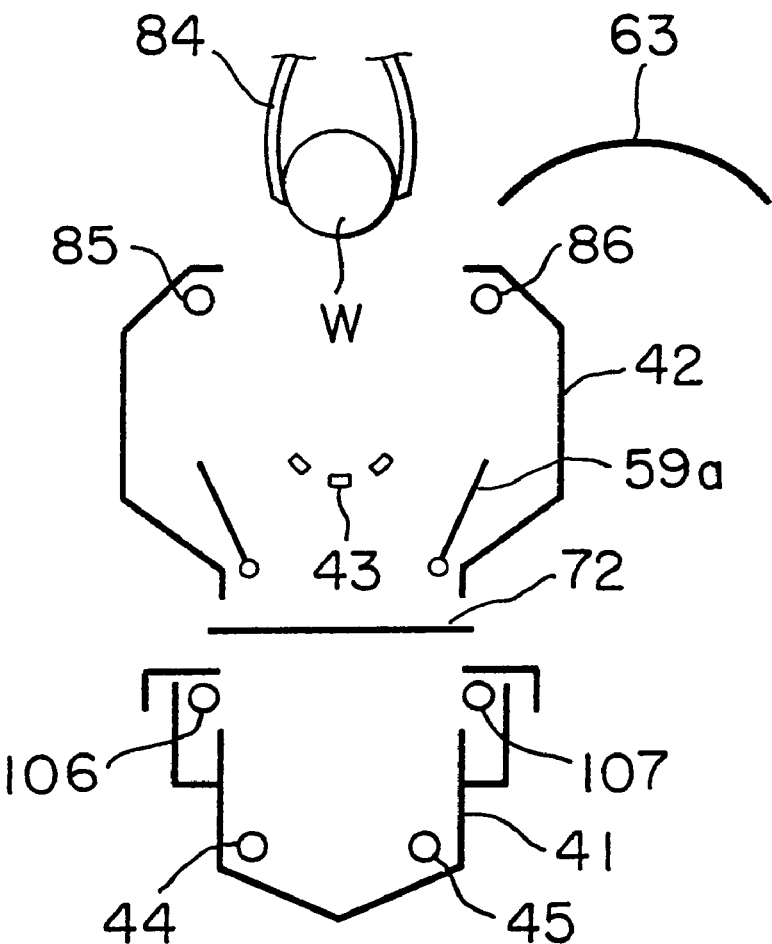
FIG. 28 is a schematic view showing the operation of the cleaning unit of FIG. 4, corresponding to a step 1418 of FIG. 15.

Thereafter, while blowing the nitrogen gas, the exhaust in the drying chamber 42 is quitted to recover the pressure of the drying chamber 42 to the normal pressure (step 1415, FIG. 25). At sequent step 1416 (FIG. 26), it is executed to open the lid 63 on the top of the drying chamber 42 and thereafter, the wafer chuck 84 is lowered into the chamber 42 to receive the wafers W from the wafer guide 43 (step 1417, FIG. 27). Then, the wafer chuck 84 is elevated to unload the wafers W to the outside of the drying chamber 42 (step 1418, FIG. 28).

In this way, according to the cleaning apparatus 27 of the embodiment, the drying chamber 42 and the cleaning bath 41 are separated from each other up and down. Further, since the space in the drying chamber 42 can be insulated from the space in the cleaning bath 41 by the rotary door 59a and the slide door 72 and since the drying process in the drying chamber 42 is executed hermetically by the closing slide door 72, there is no possibility that the drying chamber 42 and the cleaning bath 41 will mutually exert a bad influence due to the chemical and so on. In addition, since the arrangement allows the drying chamber 42 and the cleaning bath 41 to be designed under respective conditions independent of each other, it is possible to optimize the cleaning process and further miniaturize the cleaning apparatus 27 because of the enhanced degree of freedom in the process design. For instance, in order to finish the drying process quickly, the drying chamber 42 may be provided with the panel heaters 103, 104 for heating the interior of the chamber 42. Or again, the atmosphere in the drying chamber 42 may be replaced with the IPA while cleaning the wafers W in the cleaning bath 41 in view of the prompt drying process.

Further, since the drying chamber 42 can be miniaturized in comparison with that of the conventional cleaning apparatus where the processing bath and the drying chamber have been accommodated in one chamber, it is possible to carry out the drying process more effectively. Furthermore, since it is possible to decrease the volume of the drying chamber 42 to the utmost, there is no need to form the drying chamber 42 with a great pressure tightness. Thus, it is possible to reduce the wall thickness of the drying chamber 42 and decrease a power of the vacuum pump 110, which is required for the decompression.

Now, it is noted that the present invention is not limited to the above-mentioned embodiment and various changes and modifications may be made within a scope of concept of the art.

Figure 29:
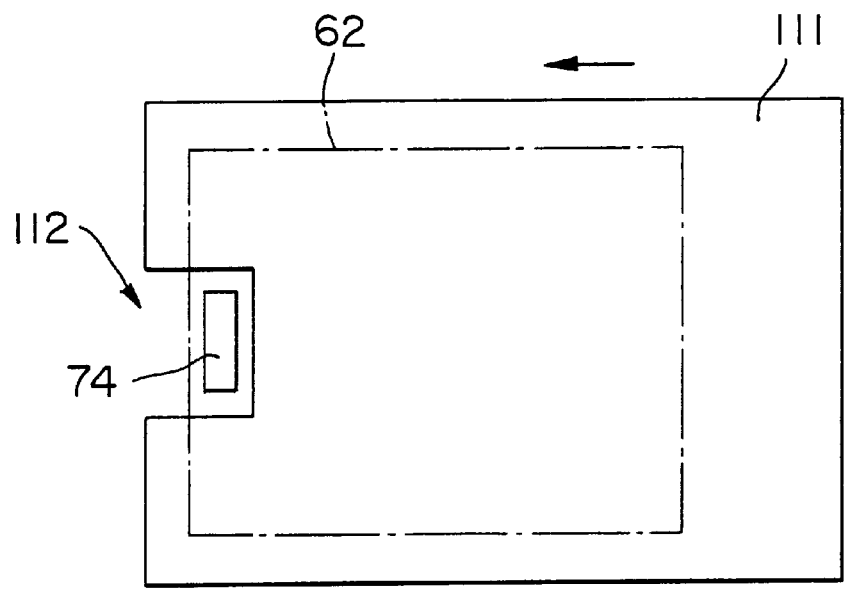
FIG. 29 is a plan view showing the slide door arrangement in accordance with another embodiment of the present invention.
Figure 30:
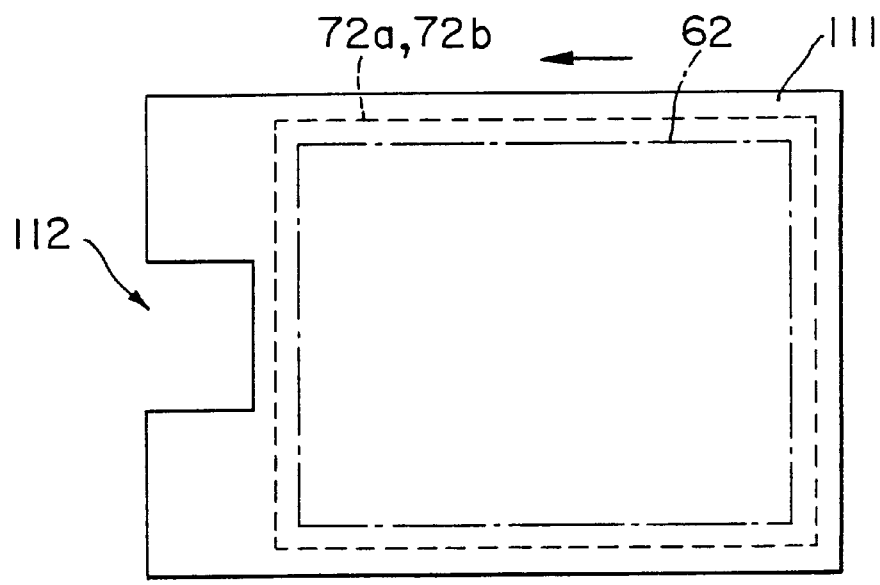
FIG. 30 is a plan view showing an another position of the slide door arrangement of FIG. 29.

For example, although the means for opening and closing the opening 62 of the drying chamber 42 is constituted by the rotary doors 59a and the slide door 72 in the above-mentioned embodiment, the same means may be replaced with a single slide door having two operational modes, as shown in FIGS. 29 and 30. That is, as shown in these figures, such a slide door 111 is formed to have a width somewhat larger than a width of the opening 62 of the drying chamber 42 and provided with a notch 112 permitting the carrying member 74 of the wafer guide 43 to pass through, different from the slide door 72 of FIGS. 10 and 11.

To describe an operation of the slide door 111 in brief, it is maintained to open the opening 62 till step 1404 of FIG. 15. During steps 1405 to 1409, in order to close the opening 62, the slide door 111 is slid so that the notch 112 overlaps with a part of the opening 62, as shown in FIG. 29. The resulting overlapping area allows the carrying member 74 to pass through the opening 62. Next, at steps 1410 to 1411, it is executed to open the opening 62 again. Then, after step 1412, the slide door 111 is moved so as to close the opening 62 perfectly, as shown in FIG. 30. Also in this case, of course, the air grip seals 72a, 72b are inflated to enhance the sealing performance.

Again, although the nitrogen gas is used as the inert gas in the above-mentioned embodiment, other inert gases, such as argon (Ar), helium (He) etc., may be used as a substitute of the nitrogen gas. It is obvious that the heating of these inert gases allows the drying process to be carried out more effectively. While, needless to say, they do not have to be heated.

Although the IPA is employed as a water-soluble organic solvent having a function to decrease the surface tension of pure water with respect to the object to be processed in the embodiment, the IPA may be replaced with other organic solvents, for example, ketonic kinds (e.g. diethyl keton), ether kinds (e.g. methyl ether, ethyl ether), multicharged alcohol (e.g. ethylene glycol) or the like.

Although the chemical treatment using the mixture of $HF/H_2O$ and the rinsing and drying processes using the pure water are executed in the cleaning apparatus 27 in the above-mentioned embodiment, it should be understood that a cleaning apparatus for and a method of executing at least the drying process and one or more other processes will be included in the scope of the invention. For example, the chemical process using the mixture of $HF/H_2O$, the rinsing process using the pure water, the chemical process using the mixture of $NH_4OH/H_2O_2/H_2O$, and the chemical process using the mixture of $HCl/H_2O_2/H_2O$ etc. are applicable to the above other processes. Accordingly, of course, the cleaning apparatus of the invention may be constructed so as to carry out, for example, the chemical process using the mixture of $NH_4OH/H_2O_2/H_2O$, the chemical process using the mixture of $HCl/H_2O_2/H_2O$, the chemical process using the mixture of $HF/H_2O$, the rinsing process using the pure water, and the drying process.

Although the above-mentioned embodiment is one example of the cleaning apparatus of the invention in association with a cleaning equipment having the processing baths in processing order, it is possible to use the present cleaning apparatus as a stand alone type apparatus. In this case, for example, it is also possible to construct the stand alone apparatus by connecting a transfer section having the loader part and unloader part with the present cleaning apparatus.

In addition, it will be understood that the object to be processed is not limited to the semi-conductor wafer of the embodiment, so that a LCD substrate, a glass substrate, a CD substrate, a photomask, a print substrate, a ceramic substrate or the like is applicable to the object to be processed by the present apparatus and method.

As mentioned above, according to the cleaning apparatus of the present invention, it includes the processing bath for storing the processing liquid in which the object is immersed; the drying chamber arranged above the processing bath and provided with the opening which is disposed between the body of the drying chamber and the processing bath and through which the object is transported, the opening being capable of closing; the transporting means for transporting the object between the processing bath and the drying chamber through the opening; and the means for filling the drying chamber with the atmosphere of organic solvent. Therefore, the object has no possibility to receive a bad influence from the chemical treatment during the drying process. In addition, since the arrangement allows the drying chamber and the processing bath to be designed under respective conditions independent of each other, it is possible to optimize the cleaning process and further miniaturize the cleaning apparatus because of the enhanced degree of freedom in the process design. Moreover, since the above-mentioned arrangement allows the volume of the drying chamber to be reduced, it is possible to reduce the wall thickness of the drying chamber and the processing bath when it is required to decompress the drying chamber while filling up with the atmosphere of the organic solvent. In addition, it is possible to make the decompression with the low-powered vacuum pump.

Furthermore, according to the cleaning apparatus of the present invention, it includes the processing bath for storing processing liquid in which the object is immersed; the drying chamber arranged above the processing bath and provided with the opening which is disposed between the body of the drying chamber and the processing bath and through which the object is transported, the opening being capable of closing; the retaining member for retaining the object; the carrying member for carrying the retaining member from the drying chamber's side, the carrying member being inserted into the processing bath through the opening in case of disposing the retaining member in the processing bath; the transporting means for transporting the object between the processing bath and the drying chamber through the carrying member; the first open and shut means for opening and shutting the opening, the first open and shut means being constructed so as to seal the drying member at the first open and shut means' shutting condition; and the second open and shut means for opening and shutting the opening, the second open and shut means being constructed so as to close the opening while leaving a clearance allowing the carrying member to pass therethrough at the second open and shut means' shutting condition; and the means for filling the drying chamber with an atmosphere of organic solvent. Consequently, it is possible to further reduce the wall thickness of the drying chamber and the power of the vacuum pump, which is required for the decompression.

Moreover, according to the cleaning apparatus of the present invention, the apparatus comprises the processing bath for storing processing liquid in which the object is immersed; the drying chamber arranged above the processing bath and provided with the opening which is disposed between the body of the drying chamber and the processing bath and through which the object is transported, the opening being capable of closing; the retaining member for retaining the object; the carrying member for carrying the retaining member from the drying chamber's side, the carrying member being inserted into the processing bath through the opening in case of disposing the retaining member in the processing bath; the transporting means for transporting the object between the processing bath and the drying chamber through the carrying member; the open and shut means for opening and shutting the opening, the open and shut means being constructed so as to seal the drying member at the first shutting mode of the open and shut means and close the opening while leaving the clearance allowing the carrying member to pass therethrough at the second shutting mode of the open and shut mean; and the means for filling the drying chamber with the atmosphere of organic solvent. Also in this case, it is possible to realize the above-mentioned reductions in the wall thickness of the drying chamber and the power of the vacuum pump required for the decompression.

Further, according to the cleaning method of the present invention, the method comprises the steps of (a) transporting the object from the drying chamber into the processing bath through the lower opening formed in the drying chamber while retaining the object by the retaining member carried on the drying chamber's side; (b) closing the lower opening after the object has been transported to the drying chamber; (c) storing processing liquid in the processing bath before or after transporting the object from drying chamber into the processing bath and subsequent immersing the object in the processing liquid; (d) opening the lower opening to transport the object from the processing bath into the drying chamber; (e) closing the lower opening; and (f) drying the substrate by the atmosphere of organic solvent in the drying chamber. Consequently, the object has no possibility of receiving a bad influence from the chemical treatment during the drying process. In addition, since the arrangement allows the drying chamber and the processing bath to be designed under respective conditions independent of each other, it is possible to optimize the cleaning process and further miniaturize the cleaning apparatus because of the enhanced degree of freedom in the process design. Moreover, since the above-mentioned arrangement allows the volume of the drying chamber to be reduced, it is possible to reduce the wall thickness of the drying chamber and the processing bath when it is required to decompress the drying chamber while filling up with the atmosphere of the organic solvent. In addition, it is possible to make the decompression with the low-powered vacuum pump.

What is claimed is:

1. A cleaning apparatus for cleaning an object to be processed, said apparatus comprising:

a processing bath for storing processing liquid in which said object is immersed, said processing bath having an upper portion defining an upper opening;

a drying chamber for drying said object, said drying chamber being enclosed with a case arranged above said processing bath, said case having a lower portion defining a lower opening, said lower opening of said drying chamber being connected with said upper opening of said processing bath between said case of said drying chamber and said processing bath;

transporting means for transporting said object between said processing bath and said drying chamber through said openings;

means for filling said drying chamber with an atmosphere of organic solvent, said filling means being in said drying chamber; and discharging means for discharging gas blown out from said filling means, said discharging means being arranged in a lower position than said filling means in said drying chamber and being arranged on two sides of said chamber.

2. A cleaning apparatus as claimed in claim 1, further including sealing means for sealing said drying chamber when said openings are closed.

3. A cleaning apparatus as claimed in claim 2, wherein said sealing means is forced onto said lower portion of said case in order to seal said drying chamber.

4. A cleaning apparatus as claimed in claim 1, wherein said filling means includes a nozzle extending in an arranging direction of said object, said nozzle having a plurality of outlets for ejecting gas into said drying chamber located along said nozzle at a same interval as that of said objects to be processed.

5. A cleaning apparatus as claimed in claim 1, further comprising an IPA supplier for supplying isopropyl alcohol, a heated nitrogen supplier for supplying heated nitrogen, and a mixer for mixing isopropyl alcohol with heated nitrogen and supplying a mixture of isopropyl alcohol and heated nitrogen.

6. A cleaning apparatus as claimed in claim 1, wherein said discharging means are arranged on both sides of said drying chamber.

7. A cleaning apparatus as claimed in claim 1, further comprising a nozzle arranged at a lower portion of said processing bath for ejecting processing liquid for said object to be processed, said nozzle extending in an arranging direction of said objects, said nozzle having a plurality of outlets for ejecting the processing liquid into said processing bath, said outlets being located along said nozzle at a same interval as that of said objects to be processed.

8. A cleaning apparatus as claimed in claim 1, further comprising open and shut means for opening and shutting said lower opening of said drying chamber, said lower opening being closed by said open and shut means when said objects are dried, said open and shut means being located under said lower opening of said case of said drying chamber and above said upper opening of said processing bath.

9. A cleaning apparatus as claimed in claim 1, wherein said case has an upper portion defining an upper aperture, and further includes a cover arranged on said upper aperture in order to open and close said upper aperture, said cover being controlled so that said cover is opened when said open and shut means is closed.

10. A cleaning apparatus as claimed in claim 1, wherein said transporting means includes:

a retaining member for retaining said object;

a supporting member for supporting said retaining member, said supporting member extending from outside of said case of said drying chamber into said inside of said processing bath, and having a lower portion provided with said retaining member, said supporting member being inserted into said processing bath through said openings when said retaining member is disposed in said processing bath;

moving means for moving said supporting member in order to move said object between said processing bath and said drying chamber, said moving means being provided on said upper portion of said supporting member, and wherein said case of said drying chamber has a peripheral portion surrounding an aperture through which said supporting member extends from outside to inside of said case of said drying chamber, and sealing means is provided between said peripheral portion and said supporting member.

11. A cleaning apparatus as claimed in claim 10, wherein said sealing means is expanded when said supporting member is not moved and when it is required to seal said drying chamber, said sealing means is contracted when said supporting member is moved.

12. A cleaning apparatus for cleaning an object to be processed, said apparatus comprising:

a processing bath for storing processing liquids in which said object is immersed, said processing bath having an upper portion defining an upper opening;

a drying chamber enclosed with a case arranged above said processing bath, said case having a lower portion defining a lower opening, said lower opening being connected with said upper opening between said case of said drying chamber and said processing bath;

a retaining member for retaining said object;

a supporting member for supporting said retaining member from said drying chamber's side, said supporting member being inserted into said processing bath through said openings when said retaining member is disposed in said processing bath;

moving means for moving said object between said processing bath and said drying chamber by said supporting member;

first open and close means for opening and closing said lower opening of said drying chamber, said first open and close means being constructed so as to seal said drying chamber when in a closing condition thereof;

second open and close means for opening and closing said lower opening of said drying chamber, said second open and close means being constructed so as to close said opening while leaving a clearance allowing said supporting member to pass there-through when in a closing condition thereof;

means for filing said drying chamber with an atmosphere of organic solvent, said filling means being in said dying chamber; and discharging means for discharging gas blown out from said filling means, said discharging means being arranged in a lower position than said filling means in said drying chamber.

13. A cleaning apparatus for cleaning an object to be processed, said apparatus comprising:

a processing bath for storing processing liquid in which said object is immersed, said processing bath having an upper portion defining an upper opening;

a drying chamber enclosed with a case arranged above said processing bath, said case having a lower portion defining a lower opening, said lower opening being connected with said upper opening between said case of said drying chamber and said processing bath;

a retaining member for retaining said object;

a supporting member for supporting said retaining member from said drying chamber's side, said supporting member being inserted into said processing bath through said openings when said retaining member is disposed in said processing bath;

moving means for moving said object between said processing bath and said drying chamber by said supporting member;

open and close means for opening and closing said openings, said open and close means being constructed so as to seal said drying chamber in a first closing mode thereof and to close said lower opening of said drying chamber while leaving a clearance allowing said supporting member to pass there-through in a second closing mode thereof;

means for filling said drying chamber with an atmosphere of organic solvent, said filling means being in said dying chamber; and discharging means for discharging gas blown out from said filling means, said discharging means being arranged in a lower position than said filling means in said drying chamber.

14. A cleaning apparatus as claimed in any one of claims 1, 12 or 13 wherein said processing liquid stored in said processing bath is a deaerated rinse.

15. A cleaning apparatus as claimed in any one of claims 1, 12 or 13 further comprising first blowing means, arranged between said processing bath and said drying chamber, for blowing inert gas against said object transported from said processing bath to said drying chamber.

16. A cleaning apparatus as claimed in claim 15, further comprising means for cooling said inert gas.

17. A cleaning apparatus as claimed in any one of claims 1, 12 or 13 further comprising:

decompressing means for decompressing said drying chamber; and second blowing means for blowing said inert gas against said object in said drying chamber.

18. A cleaning apparatus as claimed in any one of claims 1, 12 or 13 further comprising heating means, arranged in said drying chamber, for heating an interior of said drying chamber.

19. A cleaning apparatus as claimed in any one of claims 1, 12 or 13 wherein said processing liquid stored in said processing bath is a cooled rinse.

\* \* \* \* \*